(12) United States Patent
Ishikawa

(10) Patent No.: US 7,604,343 B2
(45) Date of Patent: *Oct. 20, 2009

(54) ACTINIC RAY CURABLE COMPOSITION, ACTINIC RAY CURABLE INK, IMAGE FORMATION METHOD EMPLOYING IT, AND INK-JET RECORDING APPARATUS

(75) Inventor: Wataru Ishikawa, Hachioji (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 688 days.

This patent is subject to a terminal disclaimer.

(21) Appl. No.: 10/995,400

(22) Filed: Nov. 23, 2004

(65) Prior Publication Data

US 2005/0119362 A1    Jun. 2, 2005

(30) Foreign Application Priority Data

Nov. 28, 2003   (JP)   ............................. 2003-398807

(51) Int. Cl.
  *B41M 7/00*     (2006.01)
  *C09D 11/00*    (2006.01)
  *C08L 63/00*    (2006.01)

(52) U.S. Cl. ................... 347/102; 106/31.13; 106/31.6; 106/31.85; 106/31.86; 347/100; 523/400

(58) Field of Classification Search ................ None
See application file for complete search history.

(56) References Cited

U.S. PATENT DOCUMENTS

| | | | |
|---|---|---|---|
| 6,350,792 B1 * | 2/2002 | Smetana et al. | 522/81 |
| 6,498,200 B1 * | 12/2002 | Suzuki et al. | 522/13 |
| 6,627,364 B2 * | 9/2003 | Kiguchi et al. | 430/7 |
| 7,119,130 B2 * | 10/2006 | Sasa | 522/170 |
| 7,169,446 B2 * | 1/2007 | Nishizeki et al. | 427/466 |
| 7,244,773 B2 * | 7/2007 | Sasa | 522/168 |
| 2002/0086161 A1 * | 7/2002 | Smetana et al. | 428/413 |
| 2003/0134124 A1 * | 7/2003 | Ochiai | 428/413 |
| 2003/0202082 A1 * | 10/2003 | Takabayashi | 347/105 |
| 2004/0069182 A1 * | 4/2004 | Nakajima | 106/31.13 |
| 2004/0113961 A1 * | 6/2004 | Ishikawa | 347/11 |
| 2004/0167315 A1 * | 8/2004 | Sasa | 528/406 |
| 2006/0264529 A1 * | 11/2006 | Sasa | 522/170 |

FOREIGN PATENT DOCUMENTS

EP          1013648 A2  *  6/2000
JP          2001-220526   *  8/2001

OTHER PUBLICATIONS

Property Data of diethylene glycol mono-n-butyl ether: http://www.arb.ca.gov/db/solvents/solvent_pages/Glycol_Ethers-HTML/degmnbe.htm (no date).*
Machine Translation of JP 2001-220526, provided by the JPO website (2001).*

* cited by examiner

*Primary Examiner*—Michael J Feely
(74) *Attorney, Agent, or Firm*—Lucas & Mercanti, LLP

(57) ABSTRACT

Disclosed are and actinic ray curable composition comprising, as a photopolymerizable compound, both an oxetane compound with an oxetane ring and an epoxy compound, and a non-reactive compound having a viscosity at 25° C. of from 0.1 to 20 mPa·s and a boiling point of not less than 150° C.

7 Claims, 2 Drawing Sheets

ACTINIC RAY CURABLE COMPOSITION, ACTINIC RAY CURABLE INK, IMAGE FORMATION METHOD EMPLOYING IT, AND INK-JET RECORDING APPARATUS

FIELD OF THE INVENTION

The present invention relates to an actinic ray curable composition, and particularly to an actinic ray curable ink with a low viscosity, which is capable of being cured with high speed, and forms an ink layer which is high in hardness and in adhesion to a recording sheet, an image formation method employing it, and an ink-jet recording apparatus.

BACKGROUND OF THE INVENTION

A curable composition capable of being cured by actinic rays such as ultraviolet rays or electron beams or heat has been applied to various fields, for example, coating materials for plastics, paper, or wood work; adhesives; printing inks, printed circuit boards, or electrical insulations.

In recent years, particularly a curable composition for printing inks, coating materials or adhesives is required to have higher weather resistance and higher adhesion to a substrate. As ink-jet ink employing such a curable composition, there is a UV-curable ink.

The UV-curable ink has been noted recently in respect to relatively low odor, rapid drying property, and capability of recording on a recording medium having no ink absorption. UV-curable ink jet inks are disclosed, for example, in Japanese Patent O.P.I. Publication No. 6-20204 and Japanese Patent Publication No 2000-504778. UV-curable inks are required which have a low viscosity, and provide an ink layer with high fastness, high flexibility, and high adhesion to a recording sheet. Curing speed of these UV-curable ink jet inks is likely to change due to kinds of recording sheets, or operating conditions.

An ink composition containing a radically polymerizable compound is susceptible to oxygen. Therefore, when such ink composition is used in a small amount as ink droplets, curing is likely to be inhibited. Inks employing a cationically polymerizable compound, disclosed in Japanese Patent O.P.I. Publication Nos. 2001-220526, 2002-188025, 2002-317139, and 2003-55449), are not affected by oxygen, however, they have problem in that the polymerization reaction is susceptible to moisture in the molecular level (or humidity).

SUMMARY OF THE INVENTION

The present invention has been made in view of the above. An object of the invention is to provide an actinic ray curable composition with a low viscosity, which is capable of being cured with high speed, and forms a coating layer with high hardness under various operating conditions, an actinic ray curable ink employing it, an image formation method employing it, and an ink-jet recording apparatus employing it.

DETAILED DESCRIPTION OF THE INVENTION

Figure 1:
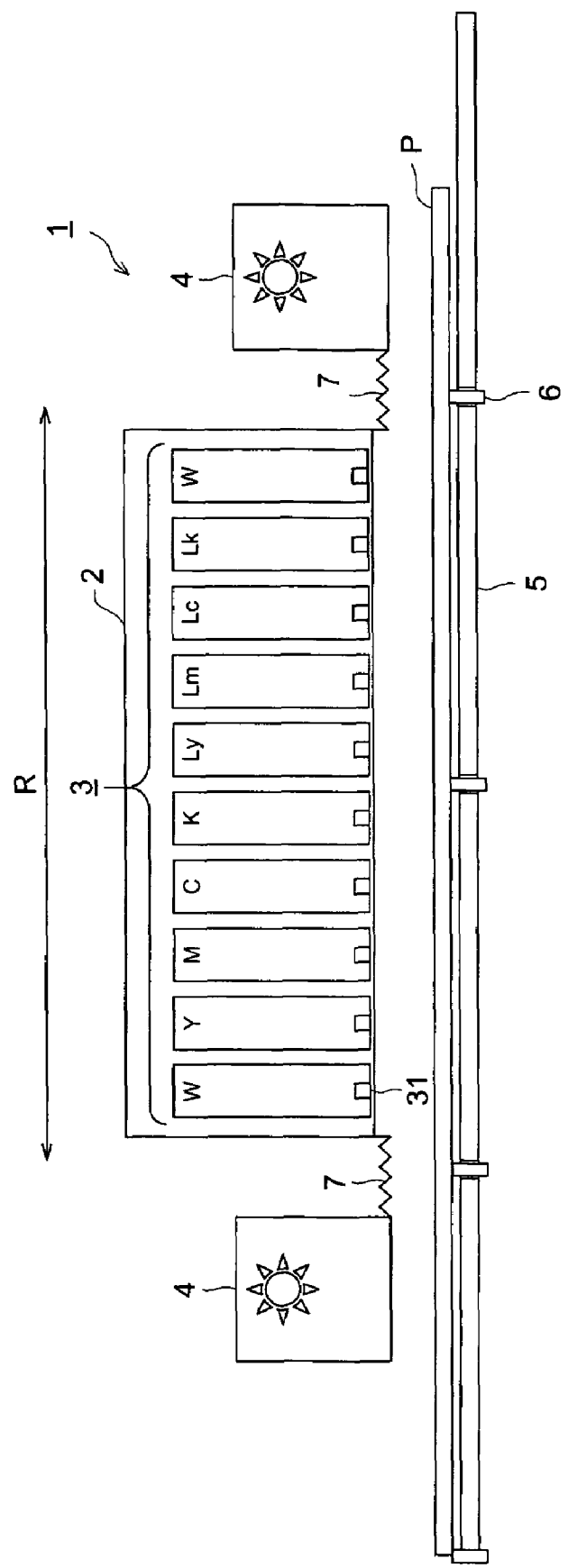
FIG. 1 shows a schematic view of one embodiment of the structure of the main section of the ink-jet recording apparatus of the invention.

The above object of the present invention can be achieved by the following:

1. An actinic ray curable composition comprising, as a photopolymerizable compound, both an oxetane compound with an oxetane ring and an epoxy compound, and a non-reactive compound having a viscosity at 25° C. of from 0.1 to 20 mPa·s and a boiling point of not less than 150° C.

2. The actinic ray curable composition of item 1 above, wherein the non-reactive compound has a viscosity at 25° C. of from 0.1 to 10 mPa·s and a boiling point of not less than 200° C.

3. The actinic ray curable composition of item 1 above, wherein the content ratio by weight of the oxetane compound to the epoxy compound is 7:3 to 3:7, and the content of the non-reactive compound is from 1 to 50% by weight.

4. The actinic ray curable composition of item 1 above, wherein the oxetane compound is an oxetane compound with an oxetane ring having a substituent at the 2-position.

5. The actinic ray curable composition of item 1 above, wherein the epoxy compound is an epoxidated fatty acid ester.

6. The actinic ray curable composition of item 5 above, wherein the epoxidated fatty acid ester is an epoxidated glyceride.

7. The actinic ray curable composition of item 1 above, wherein the epoxy compound is an alicyclic epoxy compound.

8. The actinic ray curable composition of item 7 above, wherein the alicyclic epoxy compound is an alicyclic compound represented by the following formula A:

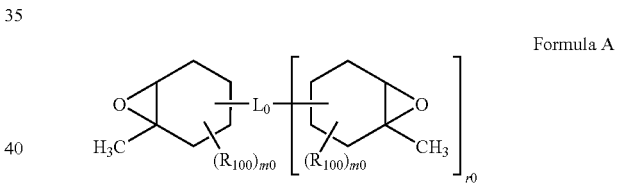

Formula A wherein $R_{100}$ represents a substituent; m0 represents an integer of from 0 to 2; r0 represents an integer of from 1 to 3; and $L_0$ represents a single bond or a (r0+1)-valent linkage group having a carbon atom number of from 1 to 15, which may contain an oxygen atom or a sulfur atom in the main chain.

9. The actinic ray curable composition of item 7 above, wherein the alicyclic epoxy compound is an alicyclic compound represented by the following formula I or II:

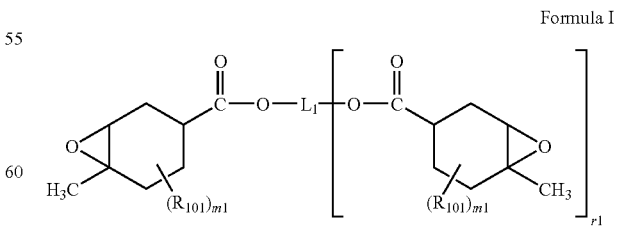

Formula I wherein $R_{101}$ represents a substituent; m1 represents an integer of from 0 to 2; r1 represents an integer of from 1 to 3; and $L_1$ represents a single bond or a (r1+1)-valent linkage group having a carbon atom number of from 1 to 15, which may contain an oxygen atom or a sulfur atom in the main chain, Formula II

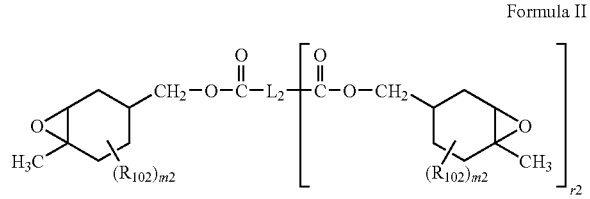

wherein $R_{102}$ represents a substituent; m2 represents an integer of from 0 to 2; r2 represents an integer of from 1 to 3; and $L_2$ represents a single bond or a (r2+1)-valent linkage group having a carbon atom number of from 1 to 15, which may contain an oxygen atom or a sulfur atom in the main chain.

10. The actinic ray curable composition of item 7 above, wherein the alicyclic epoxy compound is an alicyclic compound represented by the following formula III or IV:

Formula III

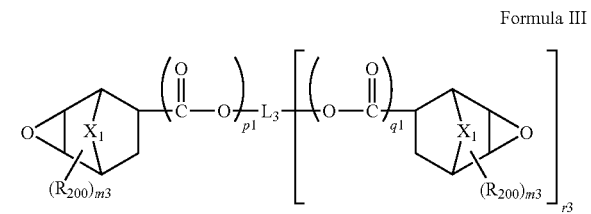

wherein $R_{200}$ represents an aliphatic group; m3 represents an integer of from 0 to 2; $X_1$ represents —$(CH_2)_{n0}$— or —$(O)_{n0}$—, in which n0 represents an integer of 0 or 1; p1 and q1 independently represent 0 or 1, provided that p1 and q1 are not simultaneously 0; r3 represents an integer of from 1 to 3; and $L_3$ represents a single bond or a (r3+1)-valent linkage group having a carbon atom number of from 1 to 15, which may contain an oxygen atom or a sulfur atom in the main chain, Formula IV

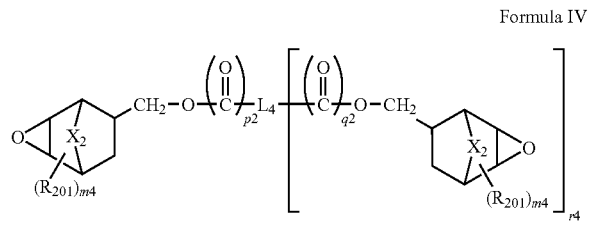

wherein $R_{201}$ represents an aliphatic group; m4 represents an integer of from 0 to 2; $X_2$ represents —$(CH_2)_{n1}$— or —$(O)_{n1}$—, in which n1 represents an integer of 0 or 1; p2 and q2 independently represent 0 or 1, provided that p2 and q2 are not simultaneously 0; r4 represents an integer of from 1 to 3; and $L_4$ represents a single bond or a (r4+1)-valent linkage group having a carbon atom number of from 1 to 15, which may contain an oxygen atom or a sulfur atom in the main chain.

11. The actinic ray curable composition of item 1 above, wherein the actinic ray curable composition has a viscosity at 25° C. of from 7 to 40 mPa·s.

12. An actinic ray curable composition comprising a radically polymerizable compound as a photopolymerizable compound, and a non-reactive compound having a viscosity at 25° C. of from 0.1 to 20 mPa·s and a boiling point of not less than 150° C.

13. The actinic ray curable composition of item 12 above, wherein the non-reactive compound has a viscosity at 25° C. of from 0.1 to 10 mPa·s and a boiling point of not less than 200° C.

14. The actinic ray curable composition of item 12 above, wherein the actinic ray curable composition has a viscosity at 25° C. of from 7 to 40 mPa·s.

15. An actinic ray curable ink comprising pigment and the actinic ray curable composition of any one of items 1 through 14 above.

16. A process of forming an image on a recording sheet employing an ink-jet recording head, the process comprising the steps of ejecting the actinic ray curable ink of item 15 above from the ink-jet recording head onto the recording sheet to form an image on the recording sheet, and exposing the image to actinic rays between 0.001 seconds and 2.0 seconds after the ink has been ejected onto the recording sheet.

17. A process of forming an image on a recording sheet employing an ink-jet recording head, the process comprising the steps of ejecting the actinic ray curable ink of item 15 above from the ink-jet recording head onto the recording sheet to form an image on the recording sheet, the ink being ejected as ink droplets from each of nozzles of the ink-jet recording head, wherein the ink droplets have a volume of from 2 to 15 pl.

18. An ink-jet recording apparatus used in the process of items 16 and 17 above, wherein the actinic ray curable ink and the ink-jet recording head was heated to a temperature of from 35 to 100° C., and then the heated ink was ejected.

19. An ink-jet recording apparatus used in the process of items 16 and 17 above, wherein the actinic ray curable ink was ejected to a recording sheet heated to a temperature of from 35 to 60° C.

1-1. An actinic ray curable composition comprising a radically polymerizable compound as a photopolymerizable compound, and a non-reactive compound having a viscosity at 25° C. of from 0.1 to 20 mPa·s and a boiling point of not less than 150° C.

1-2. An actinic ray curable composition comprising, as a photopolymerizable compound, both an oxetane compound with an oxetane ring and an epoxy compound, and a non-reactive compound having a viscosity at 25° C. of from 0.1 to 20 mPa·s and a boiling point of not less than 150° C.

1-3. The actinic ray curable composition of item 1-1 or 1-2 above, wherein the non-reactive compound has a viscosity at 25° C. of from 0.1 to 10 mPa·s and a boiling point of not less than 200° C.

1-4. The actinic ray curable composition of item 1-2 or 1-3 above, wherein the content ratio by weight of the oxetane compound to the epoxy compound is 7:3 to 3:7, and the content of the non-reactive compound is from 1 to 50% by weight.

1-5. The actinic ray curable composition of any one of items 1-2 through 1-4 above, wherein the oxetane compound is an oxetane compound with an oxetane ring having a substituent at the 2-position.

1-6. The actinic ray curable composition of any one of items 1-2 through 1-5 above, wherein the epoxy compound is an epoxidated fatty acid ester or an epoxidated glyceride.

1-7. The actinic ray curable composition of any one of items 1-2 through 1-6 above, wherein the epoxy compound is an alicyclic epoxy compound.

1-8. The actinic ray curable composition of item 1-7 above, wherein the alicyclic epoxy compound is an alicyclic compound represented by formula A above.

1-9. The actinic ray curable composition of item 1-7 above, wherein the alicyclic epoxy compound is an alicyclic compound represented by formula I or II above.

1-10. The actinic ray curable composition of item 1-7 above, wherein the alicyclic epoxy compound is an alicyclic compound represented by formula III or IV above.

1-11. The actinic ray curable composition of any one of items 1-1 through 1-10 above, wherein the actinic ray curable composition has a viscosity at 25° C. of from 7 to 40 mPa·s.

1-12. An actinic ray curable ink comprising pigment and the actinic ray curable composition of any one of items 1-1 through 1-11 above.

1-13. A process of forming an image on a recording sheet employing an ink-jet recording head, the process comprising the steps of ejecting the actinic ray curable ink of item 1-12 above from the ink-jet recording head onto the recording sheet to form an image on the recording sheet, and exposing the image to actinic rays between 0.001 seconds and 2.0 seconds after the ink has been ejected onto the recording sheet.

1-14. A process of forming an image on a recording sheet employing an ink-jet recording head, the process comprising the steps of ejecting the actinic ray curable ink of item 1-12 above from the ink-jet recording head onto the recording sheet to form an image on the recording sheet, the ink being ejected as ink droplets from each of nozzles of the ink-jet recording head, wherein the ink droplets have a volume of from 2 to 15 pl.

1-15. An ink-jet recording apparatus used in the process of item 1-13 or 1-14 above, wherein the actinic ray curable ink and the ink-jet recording head was heated to a temperature of from 35 to 100° C., and then the heated ink was ejected.

1-16. An ink-jet recording apparatus used in the process of item 1-13 or 1-14 above, wherein the actinic ray curable ink was ejected to a recording sheet heated to a temperature of from 35 to 60° C.

The present invention will be detailed below.

[Actinic Ray]

In the ink-jet ink recording method in the invention, ink-jet ink is ejected onto a recording medium (or material), and the ejected ink is cured by actinic ray exposure. Kinds of the actinic ray are not specifically limited. As actinic ray, visible or ultraviolet light or electron beam can be used, and ultraviolet light is preferably used. When ultraviolet light is used, exposure amount is preferably from 100 to 10,000 mJ/cm$^2$, and preferably from 500 to 5,000 mJ/cm$^2$. This range of exposure amount is advantageous in providing sufficient curing of ink and preventing a colorant from fading. Examples of an ultraviolet ray include a metal halide lamp, a xenon lamp, a carbon arc lamp, a chemical lamp, a low pressure mercury lamp, and a high pressure mercury lamp. An H lamp, D lamp and V lamp (all available from Fusion System Co., Ltd.) are also used.

Unlike the high pressure mercury lamp (having an emission wavelength of 365 nm as a main wavelength), the metal halide lamp has a continuous emission spectra, a high emission efficiency at the wavelength regions of from 200 to 450 nm, and rich longer wavelength light. Accordingly, as the ultraviolet ray lamp, the metal halide lamp is preferred in the invention.

[Non-Reactive Compound]

The non-reactive compound in the invention (hereinafter also referred to simply as the non-reactive compound) is a compound having a viscosity at 25° C. of from 0.1 to 20 mPa·s and a boiling point of not less than 150° C., which does not react with the photopolymerizable compound in the invention. The non-reactive compound in the invention has a viscosity at 25° C. of preferably from 0.1 to 10 mPa·s and a boiling point of preferably from 150 to 200° C.

As kinds of the non-reactive compound in the invention, there are aromatic hydrocarbon compounds, halogenated hydrocarbons, esters, ketones, and ethers. The content of the non-reactive compound in the invention in the actinic ray curable composition is preferably from 1 to 50% by weight, and more preferably from 2 to 20% by weight.

Examples of the non-reactive compound include methyl acetoacetate (bp. 172° C., viscosity: 1.6 mPa·s), 3-methyl-3-methoxybutyl acetate (bp. 188° C., viscosity: 1.7 mPa·s), cyclohexanone (bp. 156° C., viscosity: 2.0 mPa·s), ethyl lactate (bp. 155° C., viscosity: 2.4 mPa·s), methyl 2-methyllactate (bp. 137° C., viscosity: 2.6 mPa·s), propylene glycol mono-n-butyl ether (bp. 170° C., viscosity: 2.9 mPa·s), diacetone alcohol (bp. 168° C., viscosity: 3.0 mPa·s), butyl lactate (bp. 188° C., viscosity: 3.3 mPa·s), diethylene glycol monomethyl ether (bp. 194° C., viscosity: 3.5 mPa·s), and dipropylene glycol monomethyl ether (bp. 188° C., viscosity: 3.5 mPa·s).

[Radically Polymerizable Compound]

The radically polymerizable compound in the invention is a compound having an ethylenically unsaturated bond capable of being radically polymerized, and may be any as long as it has in the molecule at least one ethylenically unsaturated bond which enables radical polymerization. The radically polymerizable compound may be in the form of monomer, oligomer or polymer. The radically polymerizable compound may be used alone or as a mixture of two or more kinds thereof, according to the object.

As the radically polymerizable compound in the invention, there are unsaturated carboxylic acids such as acrylic acid, meth acrylic acid, itaconic acid, crotonic acid, isocrotonic acid, and maleic acid; and salts, esters, urethanes, amides, and anhydrides each derived therefrom; acrylonitrile; styrene; various unsaturated polyesters; various unsaturated polyethers; various unsaturated polyamides; and various unsaturated polyurethanes.

Typical examples of the radically polymerizable compound include an acrylic acid derivative such as 2-ethylhexyl acrylate, 2-hydroxyethyl acrylate, butoxyethyl acrylate, carbitol acrylate, cyclohexyl acrylate, tetrahydrofurfuryl acrylate, benzyl acrylate, bis(4-acryloxypolyethoxyphenyl)propane, neopentyl glycol diacrylate, 1,6-hexanediol diacrylate, ethylene glycol diacrylate, diethylene glycol diacrylate, triethylene glycol diacrylate, tetraethylene glycol diacrylate, polyethylene glycol diacrylate, polypropylene glycol diacrylate, pentaerythritol triacrylate, pentaerythritol tetraacrylate, dipentaerythritol tetraacrylate, trimethylolpropane triacrylate, tetramethylolmethane tetraacrylate, oligo ester acrylate, N-methylol acryl amide, diacetone acryl amide, or epoxy acrylate; a methacrylic acid derivative such as methyl methacrylate, n-butyl methacrylate, 2-ethylhexyl methacrylate, lauryl methacrylate, allyl methacrylate, glycidyl methacrylate, benzyl methacrylate, dimethylaminomethyl methacrylate, 1,6-hexanediol dimethacrylate, ethylene glycol dimethacrylate, triethylene glycol dimethacrylate, polyethylene glycol dimethacrylate, polypropylene glycol dimethacrylate, trimethylolethane trimethacrylate, trimethylolpropane trimethacrylate, or 2,2-bis(4-methacryloxy-polyethoxyphenyl)propane; an allyl compound such as alltl glycidyl ether, diallyl phthalate or triallyl trimellitate; and radical polymerizable or crosslinkable monomers, oligomers or polymers described in S. Yamashita et al., "Crosslinking agent Handbook", Taisei Co., Ltd. (1981), K. Kato et al., "UV, EB Hardenable Handbook (Materials)", Kobunshi Kankokai (1985), Radotek Kenkyukai, "UV, EB Hardening Technology, Application and Market", pp. 79, CMC Co. Ltd. (1989), and E. Takiyama, "Polyester Resin Handbook", Nikkan Kyogyo Shinbunsha (1988). The content of the radical polymerizable compound in the actinic ray curable composition is preferably from 1 to 97% by weight, and more preferably from 30 to 95% by weight.

As radical polymerization initiators, there are a triazine derivative disclosed in Japanese Patent Publication Nos. 59-1281 and 61-9621 and Japanese Patent O.P.I. Publication No. 60-60104; an organic peroxide compound disclosed in Japanese Patent O.P.I. Publication Nos. 59-1504 and 61-243807; a diazonium compound in Japanese Patent Publication Nos. 43-23684, 44-6413, 47-1604 and U.S. Pat. No. 3,567,453; an organic azide compound disclosed in U.S. Pat. Nos. 2,848,328, 2,852,379 and 2,940,853; orthoquinondiazide compounds disclosed in Japanese Patent Publication Nos. 36-22062b, 37-13109, 38-18015 and 45-9610; various onium compounds disclosed in Japanese Patent Publication No. 55-39162, Japanese Patent O.P.I. Publication No. 59-14023 and "Macromolecules", Volume 10, p. 1307 (1977); azo compounds disclosed in Japanese Patent Publication No. 59-142205; metal arene complexes disclosed in Japanese Patent O.P.I. Publication No. 1-54440, European Patent Nos. 109,851 and 126,712, and "Journal of Imaging Science", Volume 30, p. 174 (1986); (oxo) sulfonium organoboron complexes disclosed in Japanese Patent O.P.I. Publication Nos. 5-213861 and 5-255347; titanocenes disclosed in Japanese Patent O.P.I. Publication Nos. 59-152396 and 61-151197; transition metal complexes containing a transition metal such as ruthenium disclosed in "Coordination Chemistry Review", Volume 84, p. 85-277 (1988) and Japanese Patent O.P.I. Publication No. 2-182701; 2,4,5-triarylimidazol dimmer disclosed in Japanese Patent O.P.I. Publication No. 3-209477; carbon tetrabromide; and organic halide compounds disclosed in Japanese Patent O.P.I. Publication No. 59-107344.

[Oxetane Compound/Oxetane Compound]

The actinic ray curable composition of the invention preferably contains, as a photopolymerizable compound, an oxetane compound with an oxetane ring. The compound with an oxetane ring is preferably an oxetane compound with an oxetane ring having a substituent at the 2-position.

The oxetane compound preferably used in the invention will be explained below.

(Oxetane Compound with an Oxetane Ring Having a Substituent at the 2-Position)

In the invention, an oxetane compound with an oxetane ring represented by formula 1 having a substituent at the 2-position is preferably used.

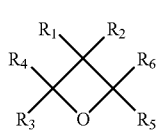

Formula 1

In formula 1, $R_1$, $R_2$, $R_3$, $R_4$, $R_5$, and $R_6$ independently represent a hydrogen atom or a substituent. At least one of $R_3$ through $R_6$ is preferably a substituent.

In formula 1, examples of the substituent represented by $R_1$, $R_2$, $R_3$, $R_4$, $R_5$, and $R_6$ include a fluorine atom, an alkyl group having from 1 to 6 carbon atoms (for example, a methyl group, an ethyl group, a propyl group, a butyl group, etc.), a fluoroalkyl group having from 1 to 6 carbon atoms, an allyl group, an aryl group (for example, a phenyl group, a naphthyl group, etc.), a furyl group and a thienyl group. These substituents may have further have the substituent.

(Oxetane Compound with One Oxetane Ring in the Molecule)

Among the above oxetane compounds, an oxetane compound with an oxetane ring represented by the following formula 2, 3, 4, or 5 is preferred.

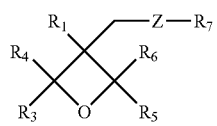

Formula 2

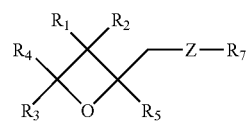

Formula 3

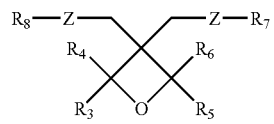

Formula 4

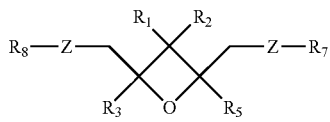

Formula 5

In formulae 2 through 5 above, $R_1$ through $R_6$ independently represent a hydrogen atom or a substituent, $R_7$ and $R_8$ independently represent a substituent, and Z represents an oxygen atom, a sulfur atom, a divalent hydrocarbon group or a divalent hydrocarbon group in which an oxygen atom or a sulfur atom is intervened.

In formulae 2 through 5 above, the substituent represented by $R_1$ through $R_6$ is the same as those denoted in $R_1$ through $R_6$ of formula 1.

In the formula 2 through 5, $R_7$ and $R_8$ independently represent an alkyl group having from 1 to 6 carbon atoms (for example, a methyl group, an ethyl group, a propyl group, a butyl group, etc.), an alkenyl group having from 1 to 6 carbon atoms (a 1-propenyl group, a 2-propenyl group, a 2-methyl-1-propenyl group, a 2-methyl-2-propenyl group, a 1-butenyl group, a 2-butenyl group, a 3-butenyl group, etc.), an aryl group (for example, a phenyl group, a naphthyl group, etc.), an aralkyl group (for example, a benzyl group, a fluorobenzyl group, a methoxybenzyl group), an acyl group having from 1 to 6 carbon atoms (a propylcarbonyl group, a butylcarbonyl group, a pentylcarbonyl group, etc.), an alkoxycarbonyl group having from 1 to 6 carbon carbons (for example, an ethoxycarbonyl group, a propoxycarbonyl group, a butoxycarbonyl group, etc.), an alkylcarbamoyl group having from 1 to 6 carbon atoms (for example, a propylcarbamoyl group, a butylpentylcarbamoyl group, etc.), and an alkoxycarbamoyl group (for example, an ethoxycarbamoyl group, etc.).

In formulae 2 through 5, the divalent hydrocarbon group represented by Z is an alkylene group (for example, an ethylene group, a trimethylene group, a tetramethylene group, a propylene group, an ethylethylene group, a pentamethylene group, a hexamethylene group, a heptamethylene group, an octamethylene group, a nonamethylene group, a decamethylene group, etc.), an alkenylene group (for example, a vinylene group, a propenylene group, etc.), an alkinylene group (an ethynylene group, or 3-pentynylene group, etc.). The divalent hydrocarbon group represented by Z in which an oxygen atom or a sulfur atom is intervened is the alkylene group, alkenylene group, or alkynylene group described above each having an oxygen atom or a sulfur atom intervened therein.

It is preferred in formulae 2 through 5 that $R_1$ is a lower alkyl group, and particularly an ethyl group, $R_7$ and $R_8$ are independently a propyl group, a phenyl group or a benzyl group, and Z is the divalent hydrocarbon group, particularly, an alkylene group, an alkenylene group, or an alkynylene group.

(Oxetane Compound with Two or More Oxetane Rings in the Molecule)

In the invention, an oxetane compound with two or more of an oxetane ring represented by the following formula 6 or 7 in the molecule can be used.

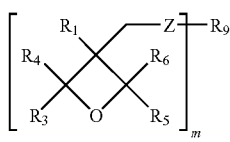

Formula 6

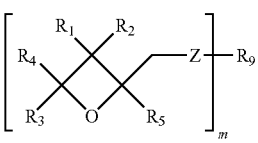

Formula 7

In formulae 6 and 7 above, m is 2, 3, or 4, and Z is the same as those denoted in Z of formulae 2 through 5. $R_1$ through $R_6$ independently represent a hydrogen atom, a fluorine atom, an alkyl group having a carbon atom number of from 1 to 6 such as a methyl group, an ethyl group, a propyl group or a butyl group, a fluoroalkyl group having a carbon atom number of from 1 to 6, an allyl group, an aryl group, or a furyl group. In formula 6, it is preferred that at least one of $R_3$ through $R_6$ is a substituent.

$R_9$ represents a straight chain or branched chain alkylene group having from 1 to 12 carbon atoms, a straight chain or branched chain poly(alkylene oxy) group, or a divalent group selected from the group consisting of the following formula 9, 10 and 11.

The straight chain or branched chain alkylene group having from 1 to 12 carbon atoms is preferably a group represented by the following formula 8.

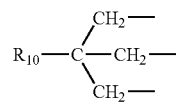

Formula 8

In formula 8, $R_{10}$ represents a lower alkyl group such as a methyl group, an ethyl group, or propyl group.

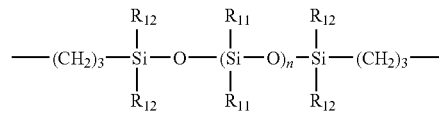

Formula 9

In the formula 9, "n" represents an integer of from 0 to 2000, $R_{12}$ represents an alkyl group having from 1 to 10 carbon atoms (for example, a methyl group, an ethyl group, a propyl group, a butyl group, a pentyl group, a hexyl group, a heptyl group, an octyl group, a nonyl group, etc.), and $R_{11}$ represents an alkyl group having from 1 to 10 carbon atoms (for example, a methyl group, an ethyl group, a propyl group, a butyl group, a pentyl group, a hexyl group, a heptyl group, an octyl group, a nonyl group, etc.), or a group represented by the following formula 12.

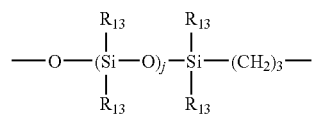

Formula 12

In the formula 12, "j" represents an integer of from 0 to 100. $R_{13}$ represents an alkyl group-having from 1 to 10 carbon atoms (for example, a methyl group, an ethyl group, a propyl group, a butyl group, a pentyl group, a hexyl group, a heptyl group, an octyl group, a nonyl group, etc.).

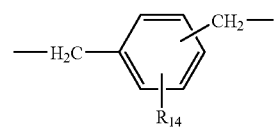

Formula 10

In the formula 10, $R_{14}$ represents an alkyl group having from 1 to 10 carbon atoms (for example, a methyl group, an ethyl group, a propyl group, a butyl group, a pentyl group, a hexyl group, a heptyl group, an octyl group, a nonyl group, etc.), an alkoxy group having from 1 to 10 carbon atoms (for example, a methoxy group, an ethoxy group, a propoxy group, a butoxy group, a pentoxy group, etc.), a halogen atom (for example, a fluorine atom, a chlorine atom, a bromine atom, a iodine atom, etc.), a nitro group, a cyano group, a mercapto group, an alkoxycarbonyl group (for example, a methyloxycarbonyl group, an ethyloxycarbonyl group, a butyloxycarbonyl group, etc.), or a carboxyl group.

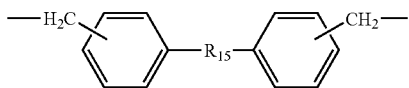

Formula 11

In the formula 10, $R_{15}$ represents an oxygen atom, a sulfur atom, —NH—, —SO—, —SO$_2$—, —(CH$_2$)—, —C(CH$_3$)$_2$— or —(CF$_3$)$_2$—.

A preferred partial structure in the molecule of the oxetane compound with an oxetane ring used in the invention will be explained below.

In formula 6 or 7, $R_1$ is preferably a lower alkyl group such as a methyl group, an ethyl group, or a propyl group, and more preferably an ethyl group. $R_9$ is preferably a hexamethylene group or one in which $R_{14}$ in formula 10 above is a hydrogen atom.

In formula 8 above, $R_{10}$ is preferably an ethyl group, and in formulae 9 and 12 above, $R_{12}$ and $R_{13}$ each are preferably hydrogen atoms. In formula 6 above, it is preferred that at least one of $R_3$ through $R_6$ is a substituent.

Further, as one of preferred embodiments of the oxetane compound with an oxetane ring in the molecule, there is a compound represented by the following formula 13.

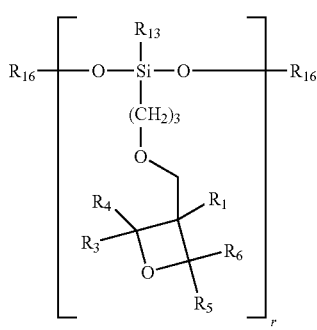

Formula 13

In the formula 13, r is an integer of from 25 to 200, $R_{16}$ represents an alkyl group having from 1 to 4 carbon atoms or a trialkylsilyl group. $R_1$ and $R_4$ through $R_6$ are the same as those denoted in formula 1. It is preferred that at least one of $R_3$ through $R_6$ is a substituent.

Exemplified compounds 1 through 15 will be listed below as examples of the oxetane compound with an oxetane ring with a substituent at the 2-position, but the invention is not limited thereto.
1: Trans-3-tert-butyl-2-phenyloxetane
2: 3,3,4,4-Tetramethyl-2,2-diphenyloxetane
3: Di[3-ethyl(2-methoxy-3-oxetanyl)]methyl ether
4: 1,4-Bis(2,3,4,4-tetramethyl-3-ethyl-oxetanyl)butane
5: 1,4-Bis(3-methyl-3-ethyloxetanyl)butane
6: Di(3,4,4-trimethyl-3-ethyloxetanyl)butane
7: 3-(2-Ethylhexyloxymethyl)-2,2,3,4-tetramethyloxetane
8: 2-(2-Ethylhexyloxy)-2,3,3,4,4-pentamethyloxetane
9: 4,4'-Bis[(2,4-dimethyl-3-ethyl-3-oxetanyl)-methoxy]biphenyl
10: 1,7-Bis(2,3,3,4,4-pentamethyloxatanylheptane)
11: Oxetanyl
12: 2-methoxy-3,3-dimethyloxatane
13: 2,2,3,3-Tetramethyloxatane
14: 2-(4-Methoxyphenyl)-3,3-dimethyloxetane
15: Di(2-(4-methoxyphenyl)-3-3-methyloxetane-3-yl)-ether The oxetane compound with an oxetane ring with a substituent at the 2-position can be synthesized according to the procedures disclosed in the following literatures.
(1) Hu Xianming, Richard M. Kellogg, Synthesis, 533-538, May (1955).
(2) A. O. Fitton, J. Hill, D. Ejane, R. Miller, Synth., 12, 1140 (1987).
(3) Toshiro Imai and Sinya Nishida, Can. J. Chem. Vol. 59, 2503-2509 (1981).
(4) Nobujiro Shimizu, Shintaro Yamaoka, and Yuho Tsuno, Bull. Chem. Soc. Jpn., 56, 3853-3854 (1983).
(5) Walter Fisher and Cyril A. Grob, Helv. Chim. Acta., 61, 2336 (1978).
(6) Chem. Ber., 101, 1850 (1968).
(7) "Heterocyclic Compounds with Three- and Four-membered Rings", Part Two, Chapter IX, Interscience Publishers, John Wiley & Sons, New York (1964).
(8) Bull. Chem. Soc. Jpn., 61, 1653 (1988).
(9) Pure Appl. Chem., A29 (10), 915 (1992).
(10) Pure Appl. Chem., A30 (2 & amp; 3), 189 (1993).
(11) Japanese Patent O.P.I. Publication No. 6-16804
(12) German Patent No. 1,021,858

The actinic ray curable ink contains the oxetane compound with an oxetane ring with a substituent at the 2-position in an amount of preferably from 1 to 97% by weight, and more preferably from 30 to 95% by weight.

(Combined Use of the Oxetane Compound with an Oxetane Ring with a Substituent at the 2-Position and Another Polymerizable Compound)

The oxetane compound with an oxetane ring with a substituent at the 2-position can be used alone or as a mixture of two or more kinds thereof. Further, the oxetane compound with an oxetane ring with a substituent at the 2-position can be used in combination with another polymerizable compound. In combined use thereof it is preferred that in a mixture the content ratio of the oxetane compound with an oxetane ring with a substituent at the 2-position to the polymerizable compound is from 10 to 98% by weight, and that of the polymerizable compound is from 2 to 90% by weight.

(Oxetane Compound with an Oxetane Ring having a Substituent Only at the 3-Position)

In the invention, in addition to the above-described oxetane compound with an oxetane ring having a substrate at the 2-position, a known oxetane compound can be used in combination, and an oxetane compound with an oxetane ring having a substituent only at the 3-position is preferably used in combination.

As the oxetane compound with an oxetane ring having a substituent only at the 3-position, known ones disclosed in Japanese Patent O.P.I. Publication Nos. 2001-220526 and 2001-310397 can be used.

As the oxetane compound with an oxetane ring having a substituent only at the 3-position, there is a compound represented by the following formula 14.

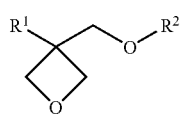

Formula 14

In formula (101), $R^1$ represents a hydrogen atom, an alkyl group having from 1 to 6 carbon atoms such as a methyl group, an ethyl group, a propyl group, a butyl group, etc.; a fluoroalkyl group having from 1 to 6 carbon atoms; an allyl group; an aryl group; a furyl group; or a thienyl group; and $R^2$ represents an alkyl group having from 1 to 6 carbon atoms such as a methyl group, an ethyl group, a propyl group, a butyl group, etc.; an alkenyl group having from 2 to 6 carbon atoms such as a 1-propenyl group, a 2-propenyl group, a 2-methyl-1-propenyl group, a 2-methyl-2-propenyl group, a 1-butenyl group, a 2-butenyl group, a 3-butenyl group, etc.), an aromatic ring-containing group such as a phenyl group, a benzyl group, a fluorobenzyl group, a methoxybenzyl group; a phenoxyethyl group, etc.; an alkylcarbonyl group having from 2 to 6 carbon atoms such as an ethylcarbonyl group, a propylcarbonyl group, a butylcarbonyl group, etc.; an alkoxycarbonyl group having from 2 to 6 carbon carbons such as an ethoxycarbonyl group, a propoxycarbonyl group, a butoxycarbonyl group, etc.; an N-alkylcarbamoyl group having from 2 to 6 carbon atoms such as an ethylcarbamoyl group, a propylcarbamoyl group, a butylcarbamoyl group, a pentylcarbamoyl, etc. The oxetane compound used in the invention is preferably a compound having one oxetane ring in that the composition containing such a compound is excellent in tackiness, low in viscosity, and is easy to handle.

As one example of an oxetane compound having two oxetane rings, an oxetane compound represented by the following formula 15 is cited.

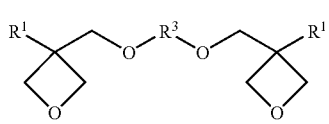

Formula 15

In formula 15, $R^1$ represents the same group as those denoted in $R_1$ in formula 14; and $R^3$ represents a straight chained or branched alkylene group such as an ethylene group, a propylene group, a butylene group, etc.; a straight chained or branched polyalkyleneoxy group such as a poly(ethyleneoxy) group, a poly(propyleneoxy group, etc.; a straight chained or branched unsaturated hydrocarbon group such a propenylene group, a methylpropenylene group, a butenylene group, etc.; an alkylene group containing a carbonyl group; an alkylene group containing a carbonyloxy group; or an alkylene group containing a carbamoyl group.

$R^3$ also represents a polyvalent group selected from groups represented by the following formulae 16, 17 and 18.

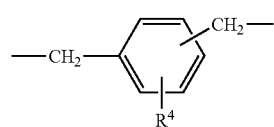

Formula 16

In formula 16, $R^4$ represents a hydrogen atom, an alkyl group having from 1 to 4 carbon atoms such as a methyl group, an ethyl group, a propyl group, a butyl group, etc.; an alkoxy group having from 1 to 4 carbon atoms such as a methoxy group, an ethoxy group, a propoxy group, a butoxy group, etc.; a halogen atom such as a chlorine atom, a bromine atom, etc.; a nitro group; a cyano group; a mercapto group; a lower alkylcarboxy group; a carboxyl group; or a carbamoyl group.

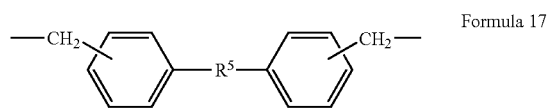

Formula 17

In formula 17, $R^5$ represents an oxygen atom, a sulfur atom, a methylene group, —NH—, —SO—, —SO$_2$—, —(CF$_3$)$_2$—, or —C(CH$_3$)$_2$—.

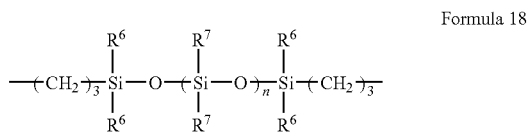

Formula 18

In formula 18, $R^6$ represents an alkyl group having from 1 to 4 carbon atoms such as a methyl group, an ethyl group, a propyl group, a butyl group, etc., or an aryl group; "n" represents an integer of from 0 to 2000; and $R^7$ represents an alkyl group having from 1 to 4 carbon atoms such as a methyl group, an ethyl group, a propyl group, a butyl group, etc., or an aryl group, or a group represented by the following formula 19.

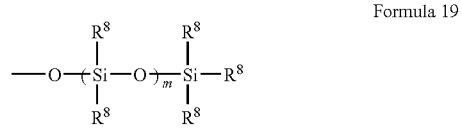

Formula 19

In formula 19, $R^8$ represents an alkyl group having from 1 to 4 carbon atoms such as a methyl group, an ethyl group, a propyl group, a butyl group, etc., or an aryl group; and m represents an integer of from 0 to 100.

Examples of a compound having two oxetane rings include the following compounds.

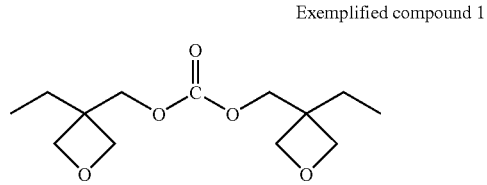

Exemplified compound 1

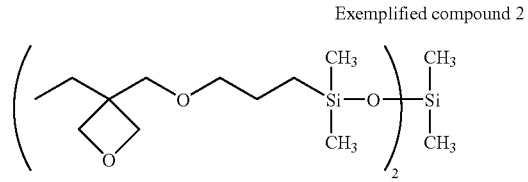

Exemplified compound 2

Exemplified compound 1 is a compound in which in formula 15, $R^1$ is an ethyl group, and $R^3$ is a carbonyl group. Exemplified compound 2 is a compound in which in formula 15, $R^1$ is an ethyl group, and $R^3$ is a group in which in formula 18, $R^6$ is a methyl group, $R^7$ is a methyl group, and n is 1.

As another example of an oxetane compound having two oxetane rings, an oxetane compound represented by the following formula 20 is cited. In formula 20, $R^1$ is the same as those denoted in $R^1$ of formula 14 above.

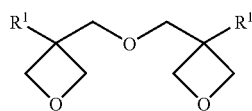

Formula 20

As an example of an oxetane compound having three or four oxetane rings, an oxetane compound represented by the following formula 21 is cited.

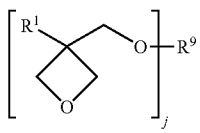

Formula 21

In formula 21, $R^1$ is the same as those denoted in $R^1$ of formula 14; $R^9$ represents a branched alkylene group having 1 to 12 carbon atoms such as a group represented by formula A, B or C below, a branched polyalkyleneoxy group such as a group represented by formula D below, or a branched alkylene group containing a silylether group such as a group represented by E below; and j represents an integer of 3 or 4.

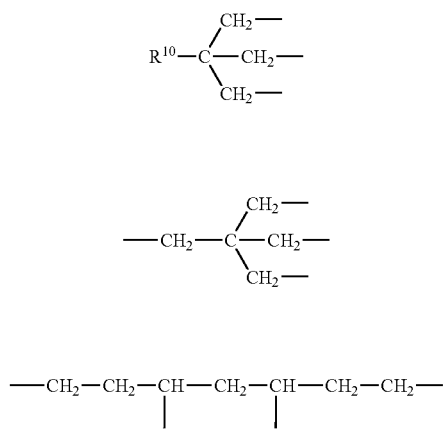

A

B

C

D

E

In formula A, $R^{10}$ represents a lower alkyl group such as a methyl group, an ethyl group, or a propyl group. In formula D, p represents an integer of from 1 to 10.

As an example of an oxetane compound having four oxetane rings, Exemplified compound 3 below is cited.

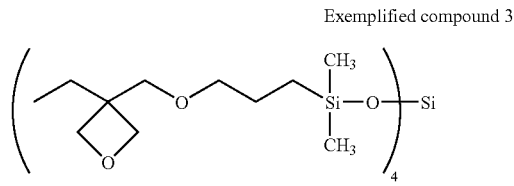

Exemplified compound 3

As a compound having 1 to 4 oxetane rings other than the compounds-described above, a compound represented by formula 22 below is cited.

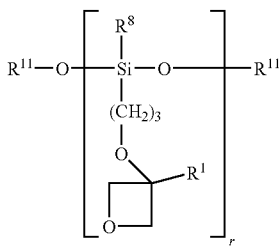

Formula 22

In formula 22, $R^8$ is the same as those denoted in $R^8$ of formula 19; $R^{11}$ represents an alkyl group having 1 to 4 carbon atoms such as a methyl group, an ethyl group, a propyl group or a butyl group, or a trialkylsilyl group; r represents an integer of from 1 to 4, and $R^1$ is the same as those denoted in $R^1$ of formula 14.

The preferred oxetane compounds used in the invention are Exemplified compounds 4, 5, and 5 as shown below.

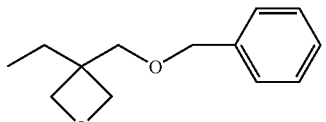

Exemplified compound 4

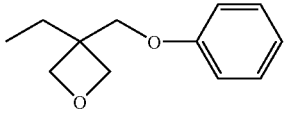

Exemplified compound 5

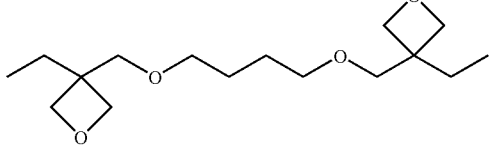

Exemplified compound 6

Synthetic method of the above-described oxetane compounds not specifically limited, and known methods can be used. There is, for example, a method disclosed in D. B. Pattison, J. Am. Chem. Soc., 3455, 79 (1957) in which an oxetane ring is synthesized from diols.

Besides the above-described oxetane compounds, polymeric oxetane compounds having 1 to 4 oxetane rings with a molecular weight of 1000 to 5000 can be used. Examples thereof include the following exemplified compounds 7, 8 and 9.

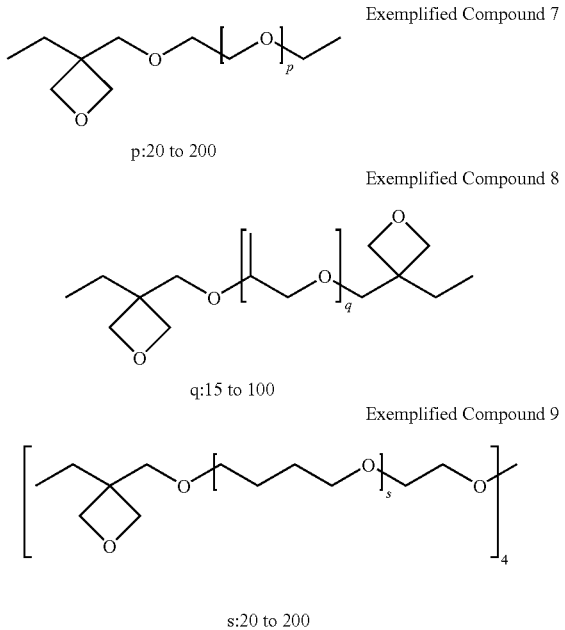

Exemplified Compound 7 p:20 to 200

Exemplified Compound 8 q:15 to 100

Exemplified Compound 9 s:20 to 200

The content of the oxetane compound in the actinic ray curable composition of the invention is preferably from 1 to 97% by weight, and more preferably from 30 to 95% by weight.

(Epoxy Compound)

The epoxy compound herein referred to is a compound with an oxirane ring (hereinafter referred to simply as the epoxy compound). As the epoxy compound, there are known epoxy compounds, for example, an aromatic epoxy compound (aromatic epoxide), an alicyclic epoxy compound (alicyclic epoxide), and an aliphatic epoxy compound (aliphatic epoxide). The epoxy compound has preferably a low molecular weight, and more preferably a molecular weight less than 1000.

The content of the alicyclic epoxy compound in the actinic ray curable composition of the invention is preferably from 10 to 80% by weight.

The aromatic epoxide is preferably a di- or poly-glycidyl ether manufactured by a reaction of polyhydric phenol having at least one aromatic ring or of an alkylene oxide adduct thereof with epichlorohydrin, and includes, for example, such as di- or poly-glycidyl ether of bisphenol A or of an alkylene oxide adduct thereof, di- or poly-glycidyl ether of hydrogenated bisphenol A or of an alkylene oxide adduct thereof and novolac type epoxy resin. Herein, alkylene oxide includes such as ethylene oxide and propylene oxide.

The alicyclic epoxide is preferably a compound containing cyclohexene oxide or cyclopentene oxide obtained by epoxydizing a compound having at least one cycloalkane ring such as cyclohexene or cyclopentene by use of a suitable oxidizing agent such as hydrogen peroxide or a peracid. Examples thereof include compounds described later.

The aliphatic epoxide is preferably a di- or polyglycidyl ether of aliphatic polyhydric alcohol or of an alkylene oxide adduct thereof; the typical examples include diglycidyl ether of alkylene glycol, such as diglycidyl ether of ethylene glycol, diglycidyl ether of propylene glycol and diglycidyl ether of 1,6-hexane diol; polyglycidyl ether of polyhydric alcohol such as di- or triglycidyl ether of glycerin or of an alkylene oxide adduct thereof; and diglycidyl ether of polyalkylene glycol such as diglycidyl ether of polyethylene glycol or of an alkylene oxide adduct thereof and diglycidyl ether of polypropylene glycol or of an alkylene oxide adduct thereof. Herein, alkylene oxide includes such as ethylene oxide and propylene oxide.

Besides the compounds above, a monoglycidyl ether of higher alcohols, phenol or cresol, which is a monomer having one oxirane ring in the molecule, can be used. Among these epoxides above, the aromatic epoxide and alicyclic epoxide are preferable, and the alicyclic epoxide is especifically preferable, taking a quick curing property in consideration. In the invention, the epoxides described above may be utilized alone or as a mixture of two or more kinds thereof.

As the alicyclic epoxide, an alicyclic epoxide represented by formula A, I, or II above is preferred, which will be explained below.

In formula A, I or II above, $R_{100}$, $R_{101}$, and $R_{102}$ independently represent a substituent. Examples of the substituent include a halogen atom (for example, a fluorine atom, a chlorine atom, a bromine atom, a iodine atom, etc.), an alkyl group having a carbon atom number of from 1 to 6 (for example, a methyl group, an ethyl group, a propyl group, an isopropyl group, or a butyl group); an alkoxy group having from 1 to 6 carbon atoms (for example, a methoxy group, an ethoxy group, a propoxy group, an isopropoxy group, an n-butoxy group, a tert-butoxy group), an acyl group (for example, an acetyl group, a propionyl group or a trifluoroacetyl group), an acyloxy group (for example, an acetoxy group, a propionyloxy group or a trifluoroacetoxy group), and an alkoxycarbonyl group (for example, a methoxycarbonyl group, an ethoxycarbonyl group, or a tert-butoxycarbonyl group, etc.). The substituent is preferably an alkyl group, an alkoxy group or an alkoxycarbonyl group.

$m_0$, $m_1$, and $m_2$ independently represent an integer of from 0 to 2, and are preferably 0 or 1.

$L_0$ represents a single bond or a $(r_0+1)$-valent linkage group having a carbon atom number of from 1 to 15, which may contain an oxygen atom or a sulfur atom in the main chain. $L_1$ represents a single bond or a $(r_1+1)$-valent linkage group having a carbon atom number of from 1 to 15, which may contain an oxygen atom or a sulfur atom in the main chain. $L_2$ represents a single bond or a $(r_2+1)$-valent linkage group having a carbon atom number of from 1 to 15, which may contain an oxygen atom or a sulfur atom in the main chain.

Examples of a divalent linkage group having a carbon atom number of from 1 to 15, which may contain an oxygen atom or a sulfur atom in the main chain include groups described below and a combination of these groups and —O—, —S—, —CO—, or —CS—.

a methylene group [—CH$_2$—],
an ethylidene group [>CHCH$_3$],
an isopropylidene group [>C(CH$_3$)$_2$],
a 1,2-ethylene group [—CH$_2$CH$_2$—],
a 1,2-propylene group [—CH(CH$_3$)CH$_2$—],
a 1,3-propanediyl group [—CH$_2$CH$_2$CH$_2$—],
a 2,2-dimethyl-1,3-propanediyl group [—CH$_2$C(CH$_3$)$_2$CH$_2$—],
a 2,2-dimethoxy-1,3-propanediyl group [—CH$_2$C(OCH$_3$)$_2$CH$_2$—],
a 2,2-dimethoxymethyl-1,3-propanediyl group [—CH$_2$C(CH$_2$OCH$_3$)$_2$CH$_2$—],
a 1-methyl-1,3-propanediyl group [—CH(CH$_3$)CH$_2$CH$_2$—],
a 1,4-butanediyl group [—CH$_2$CH$_2$CH$_2$CH$_2$—], a 1,5-pentanediyl group [—$CH_2CH_2CH_2CH_2CH_2$—],
an oxydiethylene group [—$CH_2CH_2OCH_2CH_2$—],
a thiodiethylene group [—$CH_2CH_2SCH_2CH_2$—],
a 3-oxothiodiethylene group [—$CH_2CH_2SOCH_2CH_2$—],
a 3,3-dioxothiodiethylene group [—$CH_2CH_2SO_2CH_2CH_2$—],
a 1,4-dimethyl-3-oxa-1,5-pentanediyl group [—$CH(CH_3)CH_2OCH(CH_3)CH_2$—],
a 3-oxopentanediyl group [—$C_2CH_2COCH_2CH_2$—],
a 1,5-dioxo-3-oxapentanediyl group [—$COCH_2OCH_2CO$—],
a 4-oxa-1,7-heptanediyl group [—$CH_2CH_2CH_2OCH_2CH_2CH_2$—],
a 3,6-dioxa-1,8-octanediyl group [—$CH_2CH_2OCH_2CH_2OCH_2CH_2$—],
a 1,4,7-trimethyl-3,6-dioxa-1,8-octanediyl group [—$CH(CH_3)CH_2O\ CH(CH_3)CH_2OCH(CH_3)CH_2$—],
a 5,5-dimethyl-3,7-dioxa-1,9-nonanediyl group [—$CH_2CH_2OCH_2C(CH_3)_2CH_2OCH_2CH_2$—],
a 5,5-dimethoxy-3,7-dioxa-1,9-nonanediyl group [$CH_2CH_2OCH_2C(OCH_3)_2CH_2OCH_2CH_2$—],
a 5-dimethoxymethyl-3,7-dioxa-1,9-nonanediyl group [—$CH_2CH_2OCH_2C(CH_2OCH_3)_2CH_2OCH_2CH_2$—],
a 4,7-dioxo-3,8-dioxa-1,10-decanediyl group [—$CH_2CH_2O$—$COCH_2CH_2CO$—$OCH_2CH_2$—],
a 3,8-dioxo 4,7-dioxa-1,10-decanediyl group [—$CH_2CH_2CO$—$OCH_2CH_2O$—$COCH_2CH_2$—],
a 1,3-cyclopentanediyl group [-1,3-$C_5H_8$—],
a 1,2-cyclohexanediyl group [-1,2-$C_6H_{10}$—],
a 1,3-cyclohexanediyl group [-1,3-$C_6H_{10}$—],
a 1,4-cyclohexanediyl group [-1,4-$C_6H_{10}$—],
a 2,5-tetrahydrofuranediyl group [2,5-$C_4H_6O$—],
a p-phenylene group [—P—$C_6H_4$—],
a m-phenylene group [-m-$C_6H_4$—],
an α,α'-o-xylylene group [-o-$CH_2$—$C_6H_4$—$CH_2$—],
an α,α'-m-xylylene group [-m-$CH_2$—$C_6H_4$—$CH_2$—],
an α,α'-p-xylylene group [-p-$CH_2$—$C_6H_4$—$CH_2$—],
a furane-2,5-diyl-bismethylene group [2,5-$CH_2$—$C_4H_2O$—$CH_2$—],
a thiophene-2,5-diyl-bismethylene group [2,5-$CH_2$—$C_4H_2S$—$CH_2$—],
an isopropylidene-p-phenylene group [-p-$C_6H_4$—$C(CH_3)_2$-p-$C_6H_4$—].

Examples of the 3 or more valent linkage group include groups, which is obtained by eliminating a hydrogen atom from the divalent linkage groups exemplified above, and a combination of these groups and —O—, —S—, —CO—, or —CS—.

$L_o$, $L_1$ and $L_2$ may have a substituent. Examples of the substituent include a halogen atom (for example, a chlorine atom, a bromine atom, or a fluorine atom), an alkyl group having a carbon atom number of from 1 to 6 (for example, a methyl group, an ethyl group, a propyl group, an isopropyl group, or a butyl group), an alkoxy group having a carbon atom number of from 1 to 6 (for example, a methoxy group, an ethoxy group, an n-propoxy group, an isopropoxy group, a n-butoxy group or a tert-butoxy group), an acyl group (for example, an acetyl group, a propionyl group, or a trifluoroacetyl group), an acyloxy group (for example, an acetoxy group, a propionyloxy group, or a trifluoroacetoxy group), and an alkoxycarbonyl group (for example, a methoxycarbonyl group, an ethoxycarbonyl group, or a tert-butoxycarbonyl group). Preferred substituents are an alkyl group, an alkoxy group and an alkoxycarbonyl group.

$L_o$, $L_1$ and $L_2$ represent preferably a divalent linkage group having a carbon atom number of from 1 to 8, which may contain an oxygen atom or a sulfur atom in the main chain, and more preferably a divalent linkage group having a carbon atom number of from 1 to 5, the main chain of which consists of a carbon atom.

Typical examples of the alicyclic epoxide represented by formula A, I or II will be listed later.

As the alicyclic epoxide, an alicyclic epoxide compound represented by formula (III) or (IV) above is also preferred.

In formula (III) or (IV), $R_{200}$ and $R_{201}$ independently represent an aliphatic group. Examples of the aliphatic group include an alkyl group having a carbon atom number of from 1 to 6 (for example, a methyl group, an ethyl group, a propyl group, an isopropyl group, or a butyl group); a cycloalkyl group having a carbon number of from 3 to 6 (for example, a cyclopropyl group, a cyclobutyl group, a cyclopentyl group, or a cyclohexyl group); an alkenyl group having a carbon atom number of from 1 to 6 (for example, a vinyl group, a 1-propenyl group, a 2-propenyl group, or a 2-butenyl group); and an alkinyl group having a carbon atom number of from 1 to 6 (for example, an acetylenyl group, a 1-propinyl group, a 2-propinyl group, or a 2-butinyl group). The aliphatic group is preferably an alkyl group having a carbon atom number of from 1 to 3, and more preferably a methyl group or an ethyl group.

"$m_3$" and "$m_4$" independently represent an integer of from 0 to 2, and preferably not less than 1.

$X_1$ represents —$(CH_2)_{n0}$— or —$(O)_{n0}$—, and $X_2$ represents —$(CH_2)_{n1}$— or —$(O)_{n1}$—, in which n0 and n1 independently represent an integer of 0 or 1, provided that when n0 and n1 are 0, respectively, neither $X_1$ nor $X_2$ exists. P1 and q1 independently represent 0 or 1, provided that they are not simultaneously 0. P2 and q2 independently represent 0 or 1, provided that they are not simultaneously 0.

It is preferred that ($m_3+n_0$) is not less than 1, or ($m_4+n_1$) is not less than 1.

$L_3$ represents a single bond, or a (r3+1)-valent linkage group having a branched structure, provided that the linkage group may contain an oxygen atom or a sulfur atom in the main chain; and $L_4$ represents a single bond, or a (r4+1)-valent linkage group having a branched structure, provided that the linkage group may contain an oxygen atom or a sulfur atom in the main chain.

As a divalent linkage group with a carbon number of from 1 to 15 which may contain an oxygen atom or a sulfur atom in the main chain, are cited the following groups and their combination with —O—, —S—, —CO— and/or —CS—.

an ethylidene group [>$CHCH_3$],
an isopropylidene group [>$C(CH_3)_2$],
a 2,2-dimethyl-1,3-propanediyl group [—$CH_2C(CH_3)_2CH_2$—],
a 2,2-dimethoxy-1,3-propanediyl group [—$CH_2C(OCH_3)_2CH_2$—],
a 2,2-dimethoxymethyl-1,3-propanediyl group [—$CH_2C(CH_2OCH_3)_2CH_2$—],
a 1,3-dimethyl-2-oxa-1,4-butanediyl group [—$CH(CH_3)CH_2O\ CH(CH_3)CH_2$—],
a 1,4-dimethyl-3-oxa-1,5-pentanediyl group [—$CH(CH_3)CH_2O\ CH_2OCH(CH_3)CH_2$—],
a 1,3,5-trimethyl-2,4-dioxa-1,6-hexanediyl group [—$CH(CH_3)CH_2OCH(CH_3)CH_2OCH(CH_3)CH_2$—],
a 4,4-dimethyl-2,5-dioxa-1,7-heptanediyl group [—$CH_2CH_2OCH_2C(CH_3)_2CH_2OCH_2CH_2$—],
a 4,4-dimethoxy-2,5-dioxa-1,7-heptanediyl group [—$CH_2CH_2OCH_2C(OCH_3)_2CH_2OCH_2CH_2$—],
a 4,4-dimethoxymethyl-2,5-dioxa-1,7-heptanediyl group [—$CH_2CH_2OCH_2C(CH_2OCH_3)_2CH_2OCH_2CH_2$—],
a 1,4,7-trimethyl-3,6-dioxa-1,8-octanediyl group [—$CH(CH_3)CH_2CH_2OCH(CH_3)CH_2CH_2OCH(CH_3)CH_2$—], a 5,5-dimethyl-3,7-dioxa-1,9-nonanediyl group [—CH$_2$CH$_2$OCH$_2$CH$_2$C(CH$_3$)$_2$CH$_2$CH$_2$OCH$_2$CH$_2$—], a 5,5-dimethoxy-3,7-dioxa-1,9-nonanediyl group [—CH$_2$CH$_2$OCH$_2$CH$_2$C(OCH$_3$)$_2$CH$_2$CH$_2$OCH$_2$CH$_2$—], a 5,5-dimethoxymethyl-3,7-dioxa-1,9-nonanediyl group [—CH$_2$CH$_2$OCH$_2$CH$_2$C(CH$_2$OCH$_3$)$_2$CH$_2$CH$_2$OCH$_2$CH$_2$—], an isopropylidene-p-phenylene group [-p-C$_6$H$_4$—C(CH$_3$)$_2$-p-C$_6$H$_4$—]

As a tri- or more-valent linkage group are cited a group in which an arbitrary hydrogen atom is withdrawn from the divalent linkage group described above and its combination with —O—, —S—, —CO— and/or —CS—.

L$_3$ and L$_4$ preferably have a substituent. Examples of the substituent include a halogen atom (for example, a chlorine atom, a bromine atom, or a fluorine atom), an alkyl group having a carbon atom number of from 1 to 6 (for example, a methyl group, an ethyl group, a propyl group, an isopropyl group, or a butyl group), an alkoxy group having a carbon atom number of from 1 to 6 (for example, a methoxy group, an ethoxy group, an n-propoxy group, an isopropoxy group, a n-butoxy group or a tert-butoxy group), an acyl group (for example, an acetyl group, a propionyl group, or a trifluoroacetyl group), an acyloxy group (for example, an acetoxy group, a propibnyloxy group, or a trifluoroacetoxy group), and an alkoxycarbonyl group (for example, a methoxycarbonyl group, an ethoxycarbonyl group, or a tert-butoxycarbonyl group). Preferred substituents are a halogen atom, an alkyl group, and an alkoxy group.

Typical examples of the compound represented by formula A, I, II, III, or IV will be listed below.

EP-1
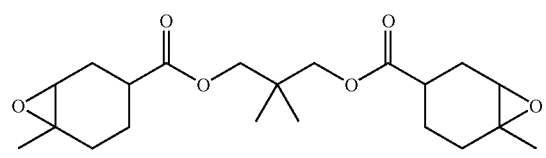
Mw:380.48

EP-2
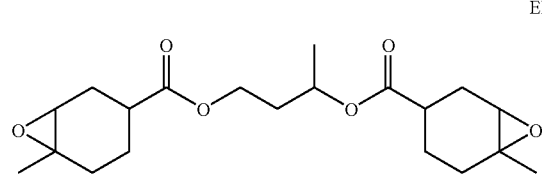
Mw:366.45

EP-3
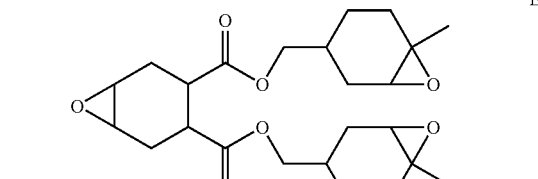
Mw:434.52
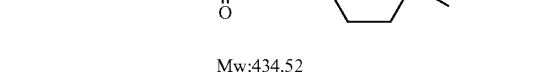

EP-4
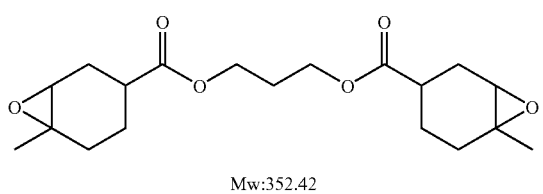
Mw:352.42

EP-5
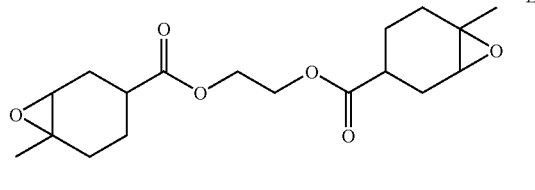
Mw:338.40

EP-6
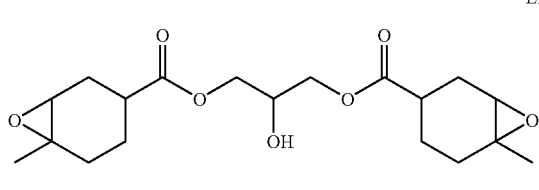
Mw:380.48

EP-7
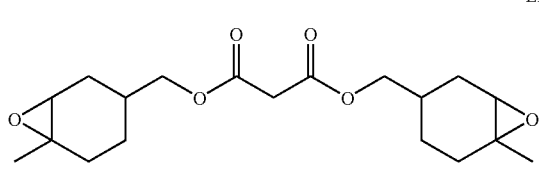
Mw:352.42

EP-8
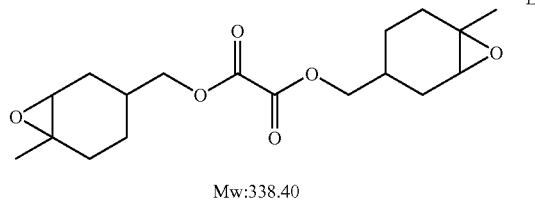
Mw:338.40

EP-9
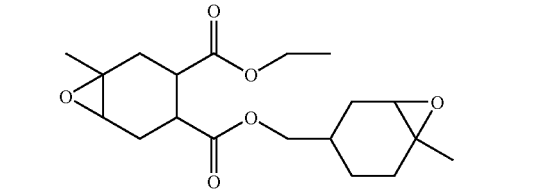
Mw:352.42

EP-10
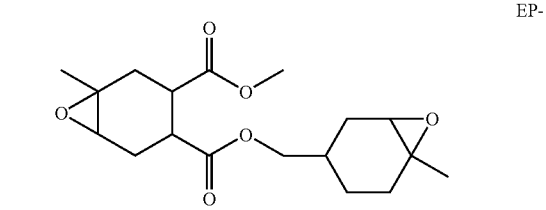
Mw:338.4

-continued

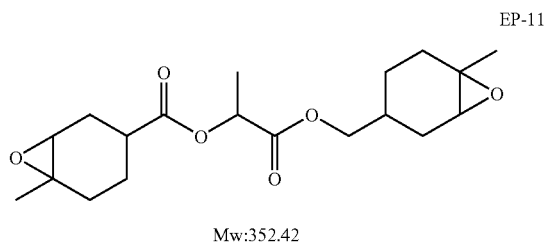

Mw:352.42

In the above, Mw is molecular weight.

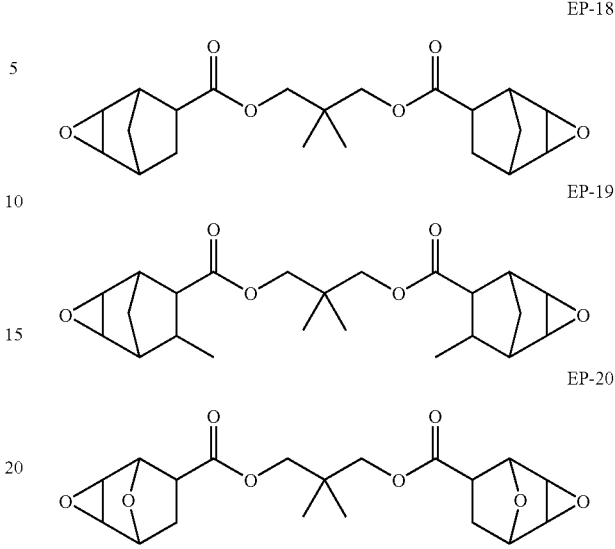

The content of the alicyclic epoxy compound in the invention is preferably from 10 to 80% by weight. In the invention, the alicyclic epoxy compound may be used alone or as a mixture of two or more kinds thereof.

A synthetic method of the epoxy compound in the invention is not specifically limited. The epoxy compound can be synthesized according to the methods described in for example, "Jiken Kagaku Koza 20, Yukigosei II", 213-(1992), Fourth Edition, published by Maruzen KK Shuppan; Ed. by Alfred Hasfner, "The chemistry of heterocyclic compounds—Small Ring Heterocycles part 3 Oxiranes", John and Wiley and Sons, An Interscience Publication, New York (1985); Yoshimura, "Secchaku", Vol. 29, 12, pp. 32 (1985); Yoshimura, "Secchaku", Vol. 30, 5, pp. 42 (1986); Yoshimura, "Secchaku", Vol. 30, 7, pp. 42 (1986); and Japanese Patent O.P.I. Publication No. 11-100378.

[Epoxidated Fatty Acid Ester or Epoxidated Glyceride]

In the invention, epoxidated fatty acid ester or epoxidated glyceride is contained in an amount of preferably up to 20% by weight, based on the actinic ray curable composition.

Incorporation of the epoxidated fatty acid ester or epoxidated glyceride is preferred in safety such as AMES, sensitization, less skin irritation or odor, and can solve problems such as occurrence of creases due to shrinkage or deterioration of curability or ejection stability which is caused depending on environmental conditions (such as temperature and humidity).

In the invention, at least one of epoxidated fatty acid ester or epoxidated glyceride is preferably used as the oxirane ring-containing compound, in view of AMES or sensitization.

The epoxidated fatty acid ester or epoxidated glyceride usable in the invention is obtained by incorporating an epoxy group into fatty acid ester or glyceride, and can be used without any limitations.

As the epoxidated fatty acid ester, there is one manufactured by epoxidation of fatty acid ester, and examples thereof include epoxy methyl stearate, epoxy butyl stearate, and epoxy octyl stearate. Similarly, as the epoxidated glyceride, there is one manufactured by epoxidation of soybean oil, linseed oil or castor oil, and examples thereof include epoxy soybean oil, epoxy linseed oil and epoxy castor oil.

The actinic ray curable composition the invention can contain a photopolymerization initiator, for example, a known photolytically acid generating agent.

As the photolytically acid generating agent, for example, compounds used in a chemical amplification type photo resist or in a light cation polymerizable composition are used (Organic electronics material seminar "Organic material for imaging" from Bunshin publishing house (1993), refer to page 187-192). Examples suitable for the present invention will be listed below.

Firstly, an onium compound, for example, a $B(C_6F_5)_4^-$, $PF_6^-$, $AsF_6^-$, $SbF_6^-$, $CF_3SO_3^-$ salt of an aromatic onium ion such as an aromatic diazonium, ammonium, iodonium, sulfonium, or phosphonium, can be listed.

Examples of the onium compounds used in the invention will be shown below.

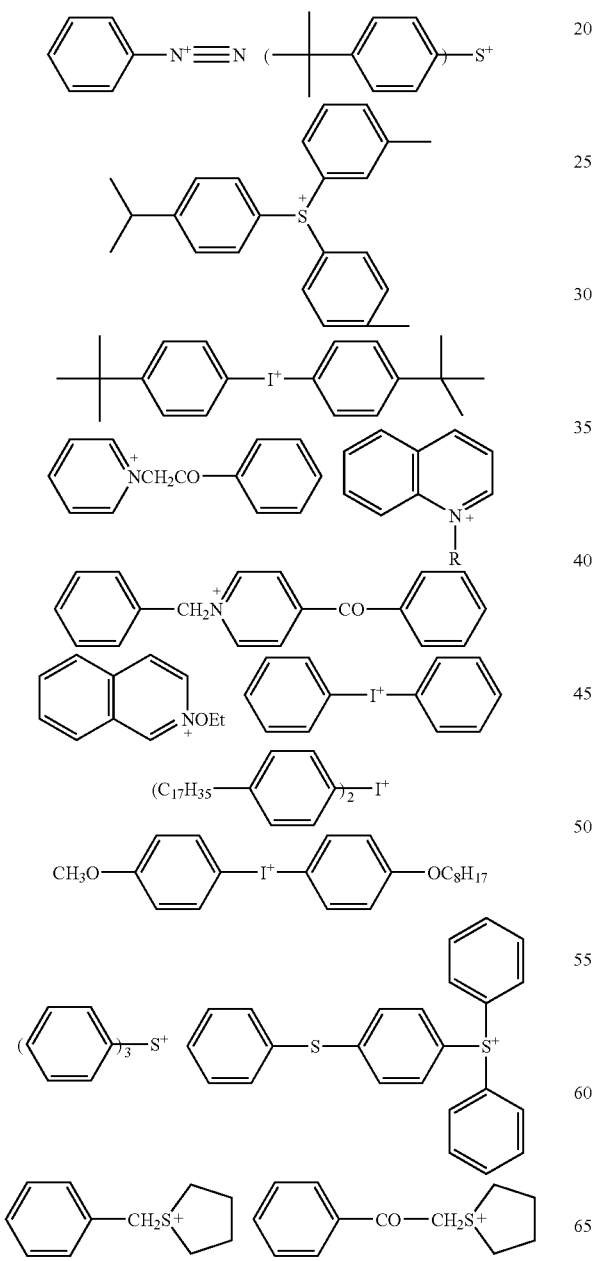

Secondly, sulfone compounds, which generate sulfonic acid, can be listed. Examples thereof will be shown below.

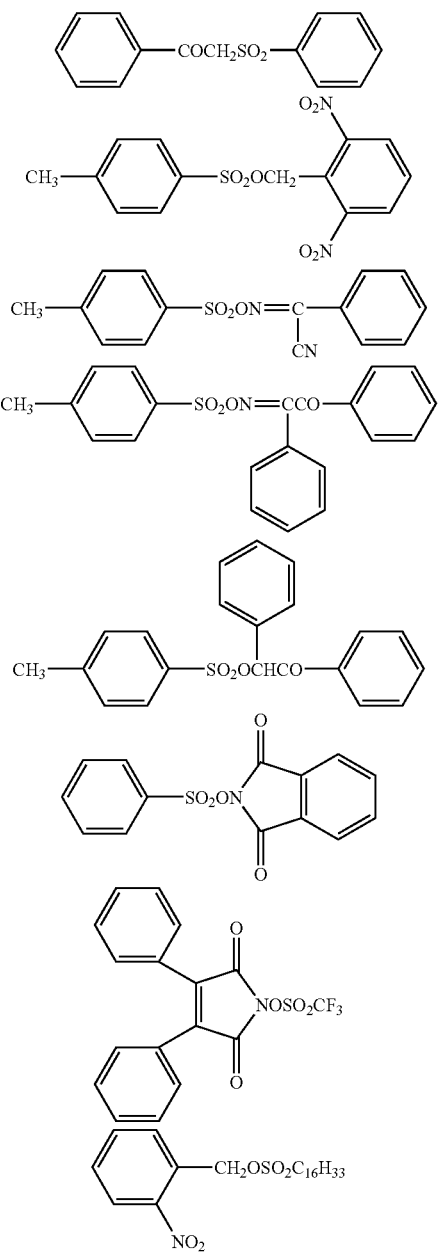

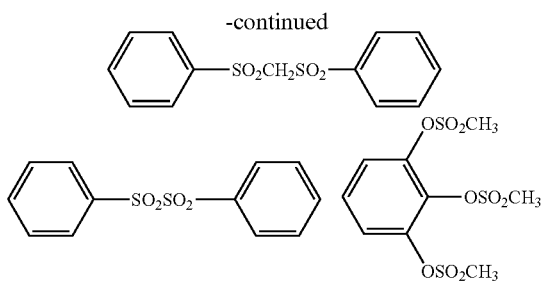

Thirdly, halide compounds, which generate hydrogen halide, can also be used. Examples thereof will be shown below.

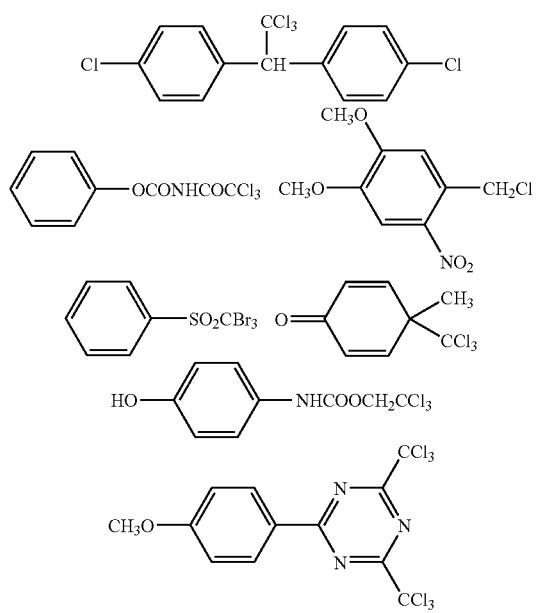

Fourthly, iron arene complexes as described below can be listed.

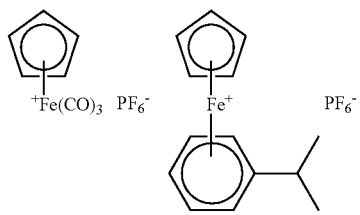

In the invention, a photolytically radical generating agent can be used in combination. Examples thereof include known photolytically radical generating agents such as aryl alkyl ketone, oxime ketone, S-phenyl thiobenzoate, titanocene, aromatic ketones, thioxanthone, benzil, quinone derivatives and coumarin derivatives. Those agents are is described in detail in "Application and Market of UV•EB Hardening Technology", edited by Radotech Kenkyuu Kai/supervised by Y. Tabata, published by CMC Syuppan. Among them, acylphosphine oxide and acylphosphonate are particularly effective for internal hardening of an ink image layer having a thickness of from 5 to 12 μm per one color ink according to an ink-jet process, since they are high in the sensitivity and reduce the light absorption on account of their photodecomposition. In concrete, bis(2,4,6-trimethylbenzoyl)-phenylphosphine oxide and bis(2,6-dimethoxybenzoyl)-2,4,4-trimethyl-pentylphosphine oxide are preferable. Like the monomer described above, 1-hydroxycyclohexyl phenyl ketone, 2-methyl-1[4-methylthio]phenyl]-2-morpholinopropane-1-one, bis(2,6-dimethoxybenzoyl)-2,4,4-trimethylpentylphosphin oxide, and 2-hydroxy-2-methyl-1-phenylpropane-1-one (DAROCURE (R) 1173) are preferably used. The addition amount of the photolytically radical generating agent is preferably from 1 to 6% by weight, and more preferably from 2 to 5% by weight, based on the ink composition.

The actinic ray curable ink of the invention contains any known dye or pigment, and preferably pigment, in addition to the actinic ray curable composition as described above.

Pigments preferably utilized in the invention will be listed below, but the invention is not limited thereto.

C.I. Pigment Yellow-1, 3, 12, 13, 14, 17, 81, 83, 87, 95, 109, 42,

C.I. Pigment Orange-16, 36, 38,

C.I. Pigment Red-S, 22, 38, 48:1, 48:2, 48:4, 49:1, 53:1, 57:1, 63:1, 144, 146, 185, 101, C.I. Pigment Violet-19, 23, C.I. Pigment Blue-15:1, 15:3, 15:4, 4, 18, 60, 27, 29, C.I. Pigment Green-7, 36, C.I. Pigment White-6, 18, 21, C.I. Pigment Black-7, Further, in the invention, white ink is preferably utilized to increase a covering power of colors with transparent base materials such as a plastic film. It is preferable to utilize white ink, specifically in light package printing and label printing, however, due to increase of ejection amount, the using amount is naturally limited in respect to the above-mentioned ejection stability, and generation of curl and wrinkles of a recording material.

To disperse the above-described pigment, for example, a ball mill, a sand mill, an attritor mill, a roll mill, an agitator, a Henshel mixer, a colloidal mixer, a ultrasonic homogenizer, a pearl mill, a wet jet mill, a paint shaker, etc. can be utilized. Further, a dispersant can be added at dispersion of a pigment. As a dispersant, a polymer dispersant is preferably utilized and Solsperse Series manufactured by Avecia Co. is included. Further, as a dispersion aid, a synergist corresponding to each kind of a pigment can also be utilized. The dispersant and dispersion aid are preferably added in a range of from 1 to 50 weight parts based on 100 parts of a pigment. As a dispersion medium, a solvent or a polymerizable compound is utilized, however, the actinic ray curable ink used in the invention is preferably an ink containing no solvent, since curing was carried out immediately after the ink was deposited on recording material. When a solvent is left in a cured image, there caused problems of deterioration of resistance against solvents and VOC of residual solvent. Therefore, as a dispersion medium, polymerizable compounds are used but a solvent not. Particularly monomers having the lowest viscosity among them are preferably used in view of dispersion suitability.

In dispersion of a pigment, selection of a pigment, a dispersant and a dispersion medium, dispersion conditions and filtering conditions are suitably set so as to make a mean particle diameter of a pigment of preferably from 0.08 to 0.5 μm and the maximum particle diameter of from 0.3 to 10 μm and preferably from 0.3 to 3 μm. By this particle diameter control, it is possible to depress clogging of a head nozzle and maintain keeping stability of ink, as well as transparency and curing sensitivity of ink.

In ink according to the invention, colorant concentration is preferably from 1 to 10 weight % based on the total ink.

Various kinds of additives other than those explained above can be added to the actinic ray curable ink of the invention. For example, a surfactant, a leveling additive, a matting agent, polyester type resin, polyurethane type resin, vinyl type resin, acryl type resin, rubber type resin and wax series can be added to the ink when necessary. Further, in order to increase storage stability, various basic compounds can be used. Examples of the basic compounds include a basic alkali metal compound, a basic alkali earth metal compound and an organic basic compound such as amine. The actinic ray curable ink of the invention may be a radical and cationic polymerization hybrid curable ink further containing a radical polymerization composition comprising a radical polymerization monomer and a radical initiator.

[Ink Properties and Recording Sheets]

It is preferred that the ink of the invention has an ink viscosity at 25° C. of from 7 to 50 mPa·s, since it provides good ejection stability regardless of ambient atmosphere conditions (such as temperature and humidity) and good curability.

As a recording material used in the invention, besides ordinary non-coated paper or coated paper, various non-absorptive plastics or their films, which are used in a so-called light packaging, can be utilized. Examples of the plastic films include for example, a polyethylene terephthalate (PET) film, an oriented polystyrene (OPS) film, an oriented polypropylene (OPP) film, an oriented nylon (Ony) film, a polyvinyl chloride (PVC) film, a polyethylene (PE) film and a triacetyl cellulose (TAC) film. As plastic films other than these, polycarbonate, acryl resin, ABS, polyacetal, PVA and a rubber series can be utilized. A metal series and a glass series are also applicable.

Plastic films greatly differ in surface energy depending on the kinds, and heretofore, there has been a problem in that the ink dot diameter after ink deposition on recording material varies depending on the kinds of the recording materials. The constitution of the invention can form an image with high precision on recording materials having a surface energy of from 35 to 60 mN/m, the recording materials ranging from those having a low surface energy such as an OPP or OPS film to those having a relatively high surface energy such as a PET film.

In the invention, a long length roll (web) of a recording material is advantageously utilized in respect to a cost of a recording material such as a packaging cost and a manufacturing cost, an efficiency of print preparation and applicability to variety of print sizes.

[Image Formation Method]

An image forming method of the invention will be explained.

In the image forming method in the invention, it is preferred that the ink described above be ejected onto a recording material according to an ink jet recording method, and then cured by irradiation of actinic ray such as UV ray.

(Thickness of Ink Layer Formed After Ink is Ejected Onto Recording Material)

In the invention, the thickness of an ink layer, after ink has been ejected onto recording material and cured by actinic ray irradiation, is preferably from 2 to 20 μm. In actinic ray curable ink jet recording in the field of screen printing, the total thickness of the ink is at present over 20 μm. Ink ejecting to give an excessive layer thickness is not preferred in the field of flexible package printing where a thin plastic film is used as a recording material, because problems are caused in that stiffness and texture of printed matter vary, in addition to problems of the aforementioned curl and wrinkles of recording material.

Herein, the thickness of ink layer refers to a maximum thickness of the ink layer deposited on recording material. This applies to a single color ink layer, and an overlapped layer of two different color (secondary color) inks, three different color inks or four different color inks (including white ink as a base ink), which are formed on recording material according to an ink jet recording process.

(Conditions of Ink Ejection)

As conditions of ink ejection, ink ejection is preferably performed while a recording head and ink being heated at from 35 to 100° C. in respect to ejection stability. Since actinic ray curable ink shows a large viscosity variation width depending on temperature variation and which in turn significantly influences a liquid droplet size and a liquid droplet ejection speed resulting in deterioration of image quality, it is required to keep an ink temperature constant while raising the ink temperature. A control width of ink temperature is a set temperature ±5° C., preferably a set temperature ±2° C. and furthermore preferably a set temperature ±1° C.

The droplet volume of the ink ejected from each ink nozzle is preferably 2 to 15 pl. The droplet volume of the ink has to be in the range described above to form images with high resolution, however, this droplet volume tends to, lower the aforementioned ejection stability. In the invention, even when a small droplet volume such as 2 to 15 pl is ejected, ejection stability is improved, and images with high resolution can be formed.

(Actinic Ray Irradiation Condition After Ink has Been Ejected Onto Recording Material)

In an image recording method of the invention, it is preferred that actinic ray is irradiated 0.001 to 2.0 seconds after ink has been ejected on recording material, and it is more preferred that actinic ray is irradiated 0.001 to 1.0 second after ink has been ejected on recording material. It is specifically important that the irradiation timing be as early as possible in order to form an image with high resolution.

As an actinic ray irradiation method, a basic method is disclosed in JP-A No. 60-132767, in which light sources are provided at the both sides of a head unit where a head and a light are scanned in a shuttle mode. Irradiation is performed in a certain time interval after ink has been ejected onto recording material. Further, curing is completed by another light source which is not driven. As a light irradiation method, a method utilizing optical fiber, and a method in which collimated light source is reflected by a mirror provided on the side surface of a head unit and UV light (ultraviolet light) is irradiated on a recording portion are disclosed in U.S. Pat. No. 6,145,979. In an image forming method of the invention, any of these irradiation methods can be utilized.

Further, a method is also a preferable embodiment, in which actinic ray irradiation is divided into two steps; firstly, a first actinic ray irradiation is carried between the period from 0.001 to 2.0 seconds after ink was deposited on recording material by the above-described method and further a second actinic ray irradiation is carried after printing has been completed. Shrinkage of recording materials caused at the time of ink curing can be depressed by dividing actinic ray irradiation into two steps.

Heretofore, in a UV ink jet method, it has been usual to utilize a light source of high illuminance having a power exceeding 1 kW·hr in order to minimize widening of dots and bleeding-out caused after ink deposition on recording material. However, particularly in such as a shrink label, utilizing the light sources makes shrinkage of a recording material too large to be used practically at present.

In the invention, an actinic ray having a maximum illuminance in a wavelength range from 280 t0 320 nm is preferably used, and even when a light source a power exceeding 1 kW·hr is used, images with high resolution can be formed, and shrinkage of a recording material is in the permissible range.

In the invention, the power of light sources irradiating an actinic ray is preferably less than 1 kW·hr. Examples of the light sources having a power of less than 1 kW·hr include a fluorescent lamp, a cold cathode tube and an LED, but are not limited thereto.

An ink jet recording apparatus (hereinafter also referred to as a recording apparatus) in the invention will be explained.

Next, the recording apparatus in the invention will be explained suitably in reference to a drawing. Herein, the recording apparatus of the drawing is only an embodiment of a recording apparatus of the invention, and a recording apparatus of the invention is not limited to the drawing.

FIG. 1 shows a schematic view of one embodiment of the structure of the main section of the ink-jet recording apparatus of the invention.

Recording apparatus 1 is equipped with head carriage 2, recording head 3, irradiation means 4 and platen portion 5. In recording apparatus 1, platen portion 5 is arranged under recording material P. Platen portion 5 has a UV ray absorbing function, and absorbs extra UV ray having passed through recording sheet P. As a result, images with high resolution can be reproduced quite stably.

Recording sheet P is guided by guide member 6 to be moved to the back side from the front side in FIG. 1 by operation of a transport means (not illustrated). Scan of recording heads 3 held in the head carriage 2 is made by reciprocating head carriage 2 in the R direction in FIG. 1 according to a head scanning means (not illustrated).

Head carriage 2 is provided over recording sheet P, and stores recording heads 3 described below with the ink ejection outlets arranged downward, the number of recording heads 3 being the same as that of different color inks used in an ink image formed on the recording sheet. Head carriage 2 is provided in the main body of recording apparatus 1 so as to reciprocate in the R direction shown in FIG. 1 by a drive of a head scanning means.

Herein, FIG. 1 illustrates that head carriage 2 is supposed to store recording heads 3 each containing a white ink composition W, a, yellow ink composition Y, a magenta ink composition M, a cyan ink composition C, a black ink composition K, a light yellow ink composition Ly, a light magenta ink composition Lm, a light cyan ink composition Lc, a light black ink composition Lk and a white ink composition W, however, the number of recording heads 3 stored in head carriage 2 in practical operation is suitably determined.

Recording heads 3 eject an actinic ray curable ink (for example, UV curable ink) to be supplied by means of an ink supplying means (not illustrated) from the ink ejection outlets onto recording sheet P by action of plural ejecting means (not illustrated) equipped in the recording apparatus. Ink to have been ejected from recording heads 3 is cured by UV irradiation.

The recording heads 3 eject ink as ink droplets onto a pre-determined region (a region capable of receiving the ink) of recording sheet P while the scan of the head is made in which the head moves from one edge to another of the recording sheet in the R direction in FIG. 1 by drive of the head-scanning means, whereby the ink is deposited on that region of the recording sheet.

The above scan is suitably made several times to eject ink onto one region of recording sheet. After that, while the recording sheet P is transported from the front side to the back side of the page in FIG. 1 by a transport means and the scan of the recording heads 3 is again made by the head scan means, ink is ejected from the recording heads onto a region adjacent to the one region of the recording sheet transported to the back side of the page.

The above operation is repeated, whereby the ink is ejected from recording heads 3 employing the head scan means and the transport means to form an image comprised of aggregates of ink droplets on recording sheet P.

Irradiation means 4 is equipped with a UV lamp which emits ultraviolet ray with a specific wavelength region at a stable exposure energy and a filter which transmits ultraviolet ray with a specific wavelength. Herein, Examples of the UV lamp include a mercury lamp, a metal halide lamp, an excimer laser, a UV laser, a cold cathode tube, a black light, and an LED, and a metal halide lamp tube, a cold cathode tube, a mercury lamp tube and a black light, having a band-shape, are preferable. Specifically a cold cathode tube and a black light which emit a 365 nm ultraviolet ray are preferable, which can prevent bleeding-out, efficiently control a dot diameter, and reduce wrinkles on curing. Utilizing a black light as a radiation source of irradiation means 4 reduces a manufacturing cost of irradiation means 4 for ink curing.

Irradiation means 4 has the possible largest size which can be installed in the recording apparatus 1 (an ink jet printer) or the irradiation region of the irradiation means 4 is larger than the largest region of recording sheet, onto which ink is ejected by one time scan of recording heads 3 driven by the head scanning means.

The irradiation means 4 is arranged nearly in parallel with recording sheet 4 at the both sides of head carriage 2, and fixed.

In order to adjust illuminance at the ink ejection outlets, the whole of recording heads 3 is light-shielded, however, in addition, it is preferable to make distance h2 between the ink ejection outlet 31 of recording heads 3 and recording sheet P longer than distance h1 between irradiation means 4 and recording sheet P (h1<h2) or to make distance d between recording heads 3 and irradiation means 4 long (to make d large). Further, it is more preferable to provide bellows structure 7 between recording heads 3 and irradiation means 4.

Herein, the wavelength of ultraviolet rays, which are irradiated through irradiation means 4 can be suitably changed by exchange of a UV lamp or a filter, which is installed in irradiation means 4.

The ink-jet ink of the invention has excellent ejection stability, and is useful especially when used in a line head type ink-jet recording apparatus.

Figure 2:
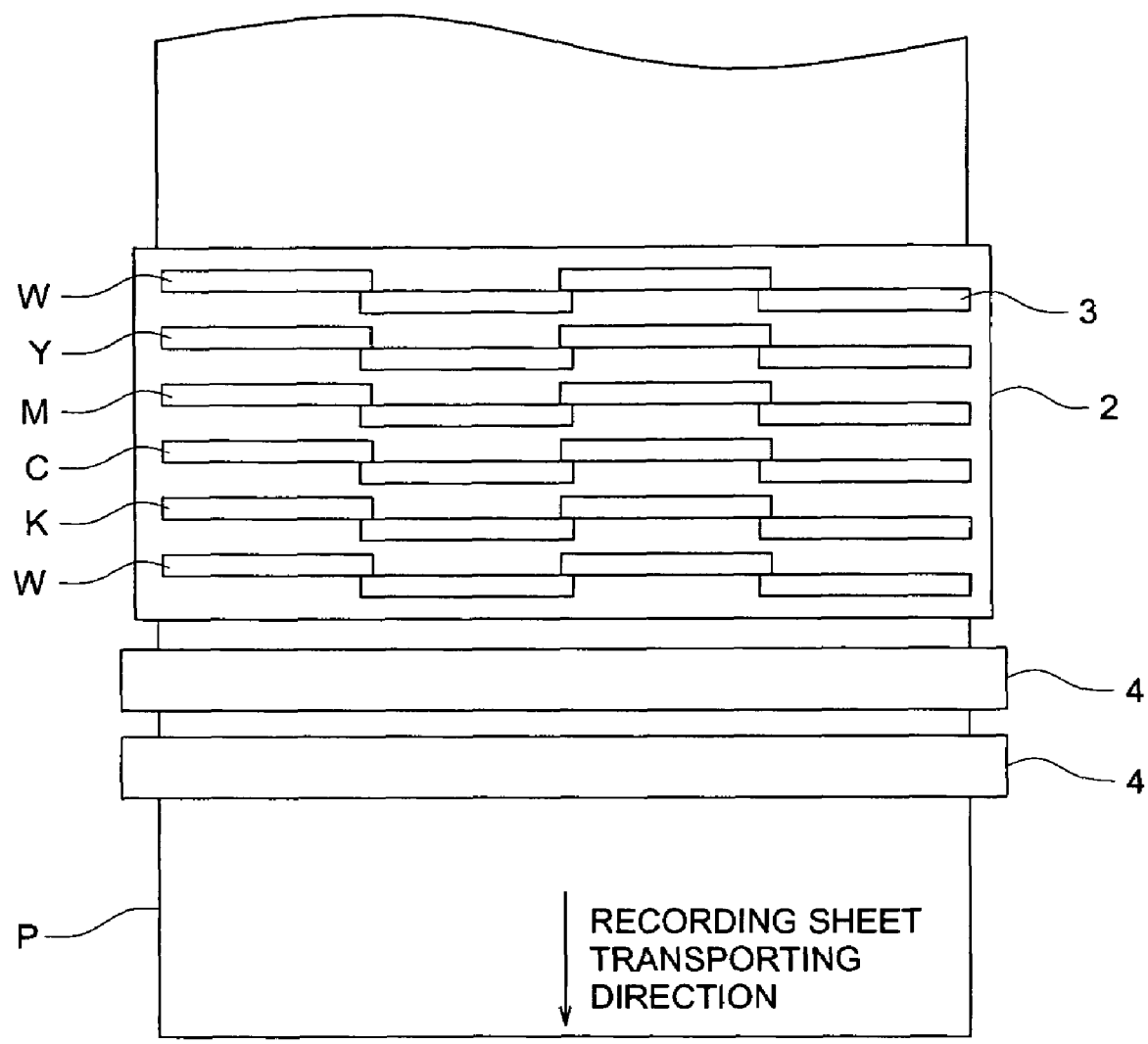
FIG. 2 shows a schematic view of another embodiment of the structure of the main section of the ink-jet recording apparatus of the invention.

FIG. 2 shows a schematic view of another embodiment of the structure of the main section of the ink-jet recording apparatus.

The ink-jet recording apparatus in FIG. 2 is called a line head type ink-jet recording apparatus. Recording heads 3 are provided in a head carriage 2 to cover the entire width of recording sheet P. The recording heads 3 each stores a different color ink, a white ink composition W, a yellow ink composition Y, a magenta ink composition M, a cyan ink composition C, a black ink composition K, and a white ink composition W.

Irradiation means 4 is provided just downstream of head carriage 2 to cover the entire width of recording sheet P and the entire printed surface. In FIG. 2, a metal halide lamp can be used as a light source in the irradiation means 4.

In the line head type recording apparatus, head carriage 2 and irradiation means 4 are fixed, and recording sheet P only is transported in the direction as shown in FIG. 2. Ink is ejected onto the recording sheet to be transported and then exposed through the irradiation means to form a cured image on the recording sheet.

EXAMPLES

The present invention will be explained in detail employing the following examples. However, the invention is not limited thereto.

Example 1

In this example, a coating layer from the actinic ray curable composition was evaluated.

[Preparation of Actinic Ray Curable Composition]

A photopolymerizable compound, a photopolymerization initiator, a non-reactive compound and other additives as shown in Table 1 were mixed to obtain an actinic ray curable composition.

[Curing of Actinic Ray Curable Composition]

The resulting actinic ray curable composition was coated on a synthetic paper sheet (synthetic paper YUPO FGS, produced by YUPO CORPORATION) to form a layer with a thickness of 3 μm, and exposed to a 800 mJ/cm2 UV rays employing a metal halide lamp to obtain a cured coating layer.

TABLE 1

Actinic Ray Curable Composition containing a radically polymerizable compound

| Actinic Ray Curable Composition | Radically Polymerizable Compound (Addition amount, Parts by weight) | | | Photopolymerization initiator (Addition amount, Parts by weight) | Non-reactive Compound (Addition amount, Parts by weight) | Remarks |
|---|---|---|---|---|---|---|
| 1 | TEDA (40) | CPEHA (20) | PEMA (30) | IRGACURE 184 (10) | None | Comp. |
| 2 | TEDA (35) | CPEHA (20) | PEMA (25) | IRGACURE 184 (10) | Hisolve BDB (10) | Inv. |
| 3 | TEDA (35) | CPEHA (20) | PEMA (25) | IRGACURE 184 (10) | Anisole (10) | Inv. |
| 4 | TEDA (35) | CPEHA (20) | PEMA (25) | IRGACURE 184 (10) | Excelpearl HO (10) | Inv. |

Comp.: Comparative,
Inv.: Inventive
TEDA: Tetraethylene diacrylate,
CPEHA: ε-Caprolactam modified pentaerythritol hexacrylate
PEMA: Phenoxyethyl methacrylate

TABLE 2

Actinic Ray Curable Composition containing a cationically polymerizable compound

| *1 | *2 | | Photopolymerization Initiator | Basic compound | Non-reactive Compound | Remarks |
|---|---|---|---|---|---|---|
|  | *3 | *4 |  |  |  |  |
| 5 | OXT221 (65) | *6 (29.5) | UVI6992 (5) | TBA (0.5) | None | Comp. |
| 6 | OXT221 (60) | *6 (24.5) | UVI6992 (5) | TBA (0.5) | HISOLVE BDB (10) | Inv. |
| 7 | OXT221 (60) | *6 (31.5) | UVI6992 (5) | TBA (0.5) | Anisole (10) | Inv. |
| 8 | OXT221 (60) | *6 (24.5) | UVI6992 (5) | TBA (0.5) | EXCELPEARL HO (10) | Inv. |
| 9 | OXT221 (60) | *6 (31.5) | UVI6992 (5) | TBA (0.5) | EXCELPEARL IPM (10) | Inv. |
| 10 | OXT221 (20) | *6 (14.5) | UVI6992 (5) | TBA (0.5) | HISOLVE DB (10) | Inv. |

TABLE 2-continued

| | | | Actinic Ray Curable Composition containing a cationically polymerizable compound | | | |
|---|---|---|---|---|---|---|
| | | *2 | Photopolymerization | Basic | Non-reactive | |
| *1 | *3 | *4 | Initiator | compound | Compound | Remarks |
| 11 | OXT221 (60) | *6 (24.5) | UVI6992 (5) | TBA (0.5) | HISOLVE BTM (10) | Inv. |
| 12 | OXT221 (60) | *6 (24.5) | UVI6992 (5) | TBA (0.5) | HIMOL TM (10) | Inv. |
| 13 | OXT221 (60) | *6 (24.5) | UVI6992 (5) | TBA (0.5) | HISOL SAS296 (10) | Inv. |
| 14 | OXT221 (34.5) | *6 (50) | UVI6992 (5) | TBA (0.5) | HISOLVE BDB (10) | Inv. |
| 15 | OXT221 (29.5) | *6 (60) | UVI6992 (5) | TBA (0.5) | HISOLVE BDB (15) | Inv. |
| 16 | OXT221 (34.5) | *6 (50) | UVI6992 (5) | TBA (0.5) | Anisole (10) | Inv. |
| 17 | OXT221 (65) | *7 (29.5) | *8 (5) | *9 (0.5) | None | Comp. |
| 18 | OXT221 (60) | *7 (24.5) | *8 (5) | *9 (0.5) | HISOLVE BDB (10) | Inv. |
| 19 | OXT221 (60) | *7 (24.5) | *8 (5) | *9 (0.5) | Anisole (10) | Inv. |
| 20 | OXT221 (60) | *7 (24.5) | *8 (5) | *9 (0.5) | EXCELPEAR HO (10) | Inv. |
| 21 | OXT221 (65) | EP-1 (29.5) | UVI6992 (5) | TBA (0.5) | None | Comp. |
| 22 | OXT221 (60) | EP-1 (24.5) | UVI6992 (5) | TBA (0.5) | HISOLVE BDB (10) | Inv. |
| 23 | OXT221 (60) | EP-1 (24.5) | UVI6992 (5) | TBA (0.5) | Anisole (10) | Inv. |
| 24 | OXT221 (60) | EP-1 (24.5) | UVI6992 (5) | TBA (0.5) | EXCELPEAR HO (10) | Inv. |
| 25 | OXT221 (60) | EP-8 (24.5) | UVI6992 (5) | TBA (0.5) | HISOLVE BDB (10) | Inv. |
| 26 | OXT221 (60) | EP-15 (24.5) | UVI6992 (5) | TBA (0.5) | HISOLVE BDB (10) | Inv. |
| 27 | OXT222 (55) | EP-15 (19.5) | UVI6992 (5) | TBA (0.5) | Anisole (20) | Inv. |
| 28 | *5 (65) | EP-8 (29.5) | UVI6992 (5) | *9 (0.5) | None | Comp. |
| 29 | *5 (60) | EP-8 (24.5) | UVI6992 (5) | *9 (0.5) | HISOLVE BDB (10) | Inv. |
| 30 | *5 (60) | EP-8 (24.5) | UVI6992 (5) | *9 (0.5) | Anisole (10) | Inv. |
| 31 | *5 (60) | EP-8 (24.5) | UVI6992 (5) | *9 (0.5) | EXCELPEAR HO (10) | Inv. |

Inv.: Inventive,
Comp.: Comparative
Numeral values in the parentheses represent an addition amount (parts by weight).
*1: Actinic Ray Curable Composition No.,
*2: Photopolymerizable Compound,
*3: Oxetane compound,
*4: Epoxy Compound,
*5: 2-Methoxy-3,3-dimethyloxetane,
*6: Celloxide 2021P,
*7: Vf7010, Vikoflex 7010, produced by ATOFINA CO., LTD.,
*8: I-250, IRGACURE 250,
*9: N-Ethyldiethanolamine
TBA: Tributylamine Compounds Used for Preparation of the Actinic Ray Curable Composition and Their Physicochemical Properties Measurement of Viscosity Viscosity was measured at a shear rate of 1000 (1/s) at 25° C., employing a viscoelasticity meter MCR 300 produced by Physica Co., Ltd.

TABLE 3

| Product (Trade name) | Viscosity (mPa·s) | Temperature at which viscosity was measured (° C.) | Boiling point (° C.) |
|---|---|---|---|
| EXELPEARLHO (produced by KAO CO., LTD.) | 14 | 25 | 228 |
| EXCELPEARLIPM (produced by KAO CO., LTD.) | 6.6 | 25 | 304 |
| HISOLVE DB (produced by TOHO CHEMICAL INDUSTRY CO., LTD.) | 6.6 | 25 | 230 |
| HISOLVE BDB (produced by TOHO CHEMICAL INDUSTRY CO., LTD.) | 2.4 | 25 | 256 |
| HISOLVE BTM (produced by TOHO CHEMICAL INDUSTRY CO., LTD.) | 2.9 | 25 | 261 |
| HIMOL TM (produced by TOHO CHEMICAL INDUSTRY CO., LTD.) | 8.3 | 25 | 249 |
| Anisole | 1.2 | 25 | 154 |
| HISOL SAS296 (produced by NIPPON PETROLEUM CHEMICAL CO., LTD.) | 8.3 | 25 | 300 |

Compounds Used in the Above

| (Photopolymerizable compound) | |
|---|---|
| CELLOXIDE 2021P: | Alicyclic epoxide, produced by DAICELL KAGAKU KOGYO CO., LTD. |
| Vf7010: | Vikoflex7010 epoxidated soybean oil, produced by ATOFINA CO., LTD. |
| OXT-221: | Oxetane Compound, produced by TOA GOSEI CO., LTD. |
| (Photolytically acid generating agent) | |
| I-250: | IRGACURE 250, produced by CIBA SPECIALTY CHEMICALS INC. |
| UVI6992: | 50% propylene carbonate solution, produced by DOW CHEMICAL CO., LTD. |
| (Photolytically radical generating agent) | |
| I-184: | IRGACURE 184, produced by CIBA SPECIALTY CHEMICALS INC. |
| (Surfactant) | |
| MEGAFACS F178k: | Perfluoroalkyl group-containing acryl oligomer, produced by DAINIPPON INK KAGAKU KOGYO CO., LTD. |
| MEGAFACS F1405: | Perfluoroalkyl group-containing ethylene oxide adduct, produced by DAINIPPON INK KAGAKU KOGYO CO., LTD. |
| (Miscibility promoting agent) | |
| HARITAC R100: | Rosin modified maleic acid resin, produced by HARIMA KAGAKU CO., LTD. |
| HARITAC 145P: | Rosin modified maleic acid resin, produced by HARIMA KAGAKU CO., LTD. |
| (Dispersant) | |
| PB822: | Product of AJINOMOTO FINE TECHNO CO., LTD. |
| (Others) | |
| N-Ethyldiethanolamine (Basic compound) | |
| Tributylamine (Basic compound) | |

[Evaluation]

(Evaluation of Cured Layer)

The resulting cured layer was evaluated according to the following methods.

1) Pencil Scratching Test

Hardness of the resulting layer was measured according to JIS K 5400.

2) Cross-Cut Adhesion Test

Adhesive tape SCOTCH #250 (produced by SUMITOMO 3M CO., LTD.) was adhered onto the cured layer of a cured sample obtained according to the cross-cut adhesion test of JIS K 5400, and a 2 kg roller was reciprocated one time to press the adhered tape. After that, the tape was quickly peeled from the cured layer, and the percentage of the remaining layer was determined.

3) Flexibility Test

The resulting actinic ray curable composition was coated on a synthetic paper sheet YUPO FGS (produced by YUPO Corporation) to obtain a layer with a thickness of 30 μm, and exposed to 800 mJ/cm$^2$ UV rays within 1 second after coated, employing a metal halide lamp to form a cured layer. The resulting cured layer was evaluated according to the flexibility test of JIS K 5600.

The results are shown in Table 4.

TABLE 4

| Sample No. | Pencil Scratching Test Pencil Hardness | Percentage of remaining layer (%) | Flexibility φ: mm | Remarks |
|---|---|---|---|---|
| 1 | 2H | 40 | **1 | Comp. |
| 2 | 2H | 60 | 3 mmφ | Inv. |
| 3 | 2H | 55 | 3 mmφ | Inv. |
| 4 | 1H | 50 | 4 mmφ | Inv. |
| 5 | 2H | 50 | 10 mmφ | Comp. |
| 6 | 2H | 80 | **2 | Inv. |
| 7 | 2H | 75 | 1 mmφ | Inv. |
| 8 | 2H | 70 | 3 mmφ | Inv. |
| 9 | 1H | 75 | 2 mmφ | Inv. |
| 10 | 1H | 70 | 2 mmφ | Inv. |
| 11 | 1H | 75 | 1 mmφ | Inv. |
| 12 | 1H | 70 | 2 mmφ | Inv. |
| 13 | 1H | 70 | 2 mmφ | Inv. |
| 14 | 2H | 80 | 1 mmφ | Inv. |
| 15 | 2H | 85 | **2 | Inv. |
| 16 | 2H | 80 | 1 mmφ | Inv. |
| 17 | 1H | 40 | 8 mmφ | Comp. |
| 18 | 1H | 60 | **2 | Inv. |
| 19 | 1H | 60 | 2 mmφ | Inv. |
| 20 | 1H | 55 | 2 mmφ | Inv. |
| 21 | 2H | 60 | 10 mmφ | Comp. |
| 22 | 2H | 85 | **2 | Inv. |
| 23 | 2H | 85 | **2 | Inv. |

TABLE 4-continued

| Sample No. | Pencil Scratching Test Pencil Hardness | Percentage of remaining layer (%) | Flexibility φ: mm | Remarks |
|---|---|---|---|---|
| 24 | 2H | 75 | 1 mmφ | Inv. |
| 25 | 2H | 80 | **2 | Inv. |
| 26 | 2H | 80 | **2 | Inv. |
| 27 | 1H | 85 | **2 | Inv. |
| 28 | 3H | 70 | 10 mmφ | Comp. |
| 29 | 3H | 95 | **2 | Inv. |
| 30 | 3H | 90 | **2 | Inv. |
| 31 | 2H | 90 | 1 mmφ | Inv. |

Comp.: Comparative,
Inv.: Inventive
**1: Cracks were observed at 10 mmφ.
**2: No cracks were observed at 1 mmφ.

As is apparent from Table 4, inventive samples provide a cured layer with improved adhesion and flexibility, and without lowering of hardness.

Example 2

Herein, ink prepared from an actinic ray curable composition was evaluated.

[Ink Set]

The photopolymerizable compound shown in Table 5 and 5 parts by weight of dispersant PB822 (produced by AJINOMOTO CO., LTD.) were incorporated into a stainless steel beaker on a 65° C. hot plate and stirred for one hour to obtain a solution. Each of the pigments as shown in Table 6 was added to the resulting solution, and incorporated in a plastic vessel together with 200 g of zirconia beads with a diameter of 1 mm. The plastic vessel was tightly sealed and dispersed in a paint shaker for 2 hours to obtain a dispersion liquid. After the zirconia beads were removed, the dispersion liquid was added with additives as shown in Table 5 such as the photopolymerization initiator, the basic compound and the surfactant, and filtered with a 0.8 μm membrane filter. Thus, ink composition set sample was obtained, which included seven different color inks.

Viscosity of the ink prepared above was 20 to 30 mPa·S.

TABLE 5

Actinic Ray Curable Composition containing a cationically polymerizable compound

| *1 | *2 *3 | *4 | Photopolymerization Initiator | Basic compound | Non-reactive Compound | *5 | *6 | Dispersant | Colorant | Remarks |
|---|---|---|---|---|---|---|---|---|---|---|
| 1 | OXT221 (60) | *8 (25.3) | UVI6992 (5) | *11 (1) | None | *13 (0.1) | *16 (5) | PB822 (1) | Pigment (3) | Comp. |
| 2 | OXT221 (50) | *8 (25.3) | UVI6992 (5) | *11 (1) | HISOLVE BDB (10) | *13 (0.1) | *16 (5) | PB822 (1) | Pigment (3) | Inv. |
| 3 | OXT221 (50) | *8 (25.3) | UVI6992 (5) | *11 (1) | Anisole (10) | *13 (0.1) | *16 (5) | PB822 (1) | Pigment (3) | Inv. |
| 4 | OXT221 (50) | *8 (25.3) | UVI6992 (5) | *11 (1) | EXCELPEARL HO (10) | *13 (0.1) | *16 (5) | PB822 (1) | Pigment (3) | Inv. |
| 5 | OXT221 (45) | *8 (25.3) | UVI6992 (5) | *11 (1) | HISOLVE BDB (15) | *13 (0.1) | *16 (5) | PB822 (1) | Pigment (3) | Inv. |
| 6 | OXT221 (20) | *8 (55.3) | UVI6992 (5) | *11 (1) | HISOLVE BDB (15) | *13 (0.1) | *16 (5) | PB822 (1) | Pigment (3) | Inv. |
| 7 | OXT221 (60) | *9 (25.3) | *10 (5) | *12 (1) | None | *13 (0.1) | *16 (5) | PB822 (1) | Pigment (3) | Comp. |
| 8 | OXT221 (50) | *9 (25.3) | *10 (5) | *12 (1) | HISOLVE BDB (10) | *13 (0.1) | *16 (5) | PB822 (1) | Pigment (3) | Inv. |
| 9 | OXT221 (50) | *9 (25.3) | *10 (5) | *12 (1) | Anisole (10) | *13 (0.1) | *16 (5) | PB822 (1) | Pigment (3) | Inv. |
| 10 | OXT221 (60) | EP-1 (25.3) | UVI6992 (5) | *11 (1) | None | *14 (0.1) | *17 (5) | PB822 (1) | Pigment (3) | Comp. |
| 11 | OXT221 (50) | EP-1 (25.3) | UVI6992 (5) | *11 (1) | HISOLVE BDB (10) | | | PB822 (1) | Pigment (3) | Inv. |
| 12 | OXT221 (50) | EP-1 (25.3) | UVI6992 (5) | *11 (1) | Anisole (10) | *14 (0.1) | *17 (5) | PB822 (1) | Pigment (3) | Inv. |
| 13 | OXT221 (30) | EP-1 (15.3) | UVI6992 (5) | *11 (1) | EXCELPEARL HO (10) | *14 (0.1) | *17 (5) | PB822 (1) | Pigment (3) | Inv. |
| 14 | OXT222 (55) | EP-2 (25.3) | UVI6992 (5) | *11 (1) | Anisole (5) | *15 (0.1) | *18 (5) | PB822 (1) | Pigment (3) | Inv. |
| 15 | OXT221 (50) | EP-8 (25.3) | UVI6992 (5) | *11 (1) | HISOLVE BDB (10) | *14 (0.1) | *17 (5) | PB822 (1) | Pigment (3) | Inv. |
| 16 | OXT221 (50) | EP-15 (25.3) | UVI6992 (5) | *11 (1) | HISOLVE BDB (10) | *14 (0.1) | *17 (5) | PB822 (1) | Pigment (3) | Inv. |
| 17 | *7 (60) | EP-8 (25.3) | UVI6992 (5) | *12 (1) | None | *14 (0.1) | *16 (5) | PB822 (1) | Pigment (3) | Comp. |
| 18 | *7 (55) | EP-8 (25.3) | UVI6992 (5) | *12 (1) | Anisole (5) | *14 (0.1) | *16 (5) | PB822 (1) | Pigment (3) | Inv. |
| 19 | *7 (50) | EP-8 (25.3) | UVI6992 (5) | *12 (1) | HISOLVE BDB (10) | *14 (0.1) | *16 (5) | PB822 (1) | Pigment (3) | Inv. |

TABLE 5-continued

Actinic Ray Curable Composition containing a cationically polymerizable compound

| *1 | *2 *3 | *4 | Photopolymerization Initiator | Basic compound | Non-reactive Compound | *5 | *6 | Dispersant | Colorant | Remarks |
|---|---|---|---|---|---|---|---|---|---|---|
| 20 | *7 (45) | EP-8 (25.3) | UVI6992 (5) | *12 (1) | HISOLVE BDB (15) | *14 (0.1) | *16 (5) | PB822 (1) | Pigment (3) | Inv. |

Inv.: Inventive,
Comp.: Comparative
Numeral values in the parentheses represent an addition amount (parts by weight).
In Table 5, *marked numerals represent the following:
*1: Actinic Ray Curable Composition No.,
*2: Photopolymerizable Compound,
*3: Oxetane compound,
*4: Epoxy Compound,
*5: Nonionic fluorine-containing surfactant,
*6: Rosin-modified maleic acid resin,
*7: 2-Methoxy-3, 3-dimethyloxetane,
*8: Celloxide 2021P,
*9: Vf7010, Vikoflex 7010, produced by ATOFINA CO., LTD.,
*10: I-250, IRGACURE 250,
*11: Tributylamine,
*12: N-Ethyldiethanolamine,
*13: MEGAFAC F1405,
*14: MEGAFAC F178k,
*15: MEGAFAC F179k,
*16: HARITAC 145P,
*17: HARITAC R100,
*18: HARITAC R101, Pigments used in the ink set samples are shown in Table 6. Inks, Lk, Lc, Lm and Ly represent light color inks, and employed ⅕ of the amount used in inks K, C, M, and Y, respectively.

Further, the following ink set samples were prepared. Ink set sample No. 21: To the sample No. 17 were added 10% by weight of acetone (bp. 56° C.).

Ink set sample No. 22: To the sample No. 17 were added 10% by weight of silicone oil SH 550 (produced by TORAY DOW CORNING CO., LTD., viscosity: 130 mPa·S).

TABLE 6

| | Ink | | | | | | | | |
|---|---|---|---|---|---|---|---|---|---|
| | K | C | M | Y | W | Lk | Lc | Lm | Ly |
| Pigment used | CI Pigment Black 7 | CI Pigment Blue 15:3 | CI Pigment Red 57:1 | CI Pigment Yellow 13 | Titanium Oxide: Anatase type, Particle diameter: 0.2 μm | CI Pigment Black 7 | CI Pigment Blue 15:3 | CI Pigment Red 57:1 | CI Pigment Yellow 13 |

[Ink-Jet Image Formation Method]

The ink set sample prepared above was mounted on an ink jet recording apparatus as shown in FIG. 1 equipped with a piezo-type ink jet nozzle, and image recording was performed continuously on each of 600 mm wide and 1000 m long recording sheets described later.

An ink supply system is comprised of an ink tank, a supply pipe, a pre-chamber ink tank directly before a head, a piping attached with a filter, and a piezo-head, and the portion from the pre-chamber tank to the head was heated at 50° C. The piezo-head was appropriately heated to meet viscosity of each ink and driven so as to eject ink droplets of from 2 to 15 pl at a resolution of 720 dpi×720 dpi. Thus, each ink was continuously ejected onto the recording sheet.

The recording sheet was heated to 50° C. by a heater. Within less than 0.5 seconds after ink was ejected and arrived at the recording sheet, exposure was carried out, employing the light sources on both sides of the carriage to form a cured ink image. As the light source, light source A, a high pressure mercury lamp Vzero 085, produced by INTEGRATION TECHNOLOGY CO., or light source B, a metal halide lamp MAL400NL, produced by NIPPON DENCHI CO., LTD., 120 W/cm, output power: 3 kW·hr), was employed.

The total thickness of the resulting ink image layer was measured to be in a range of from 2.3 to 13 μm. Herein, dpi represents a dot number per 2.54 cm.

The above ink image formation was carried out at 32° C. and 80% RH.

Luminance of each light source was measured through employing UVPF-Al produced by IWASAKI DENKI CO., LTD., and integrated illuminance was determined.

In Table 7, abbreviation of each of the recording sheets is as follows:

YUPO FGS: Synthetic paper produced by YUPO CORPORATION

PVC: Polyvinyl chloride (Ejection Property)

Ink was continuously ejected for 30 minutes, and thereafter, failure of the ink was visually observed according to the following criteria.

A: No ink failure was observed, resulting in good level.

B: A little ink failure was observed but not problematic.

C: Some ink failure was observed and was the level having an influence on image quality.

D: Much ink failure was observed and impermissible level.

<Evaluation of Ink Jet Ink Image>

The following evaluations were carried out with respect to each image recorded according to the above-described image forming method.

(Character Quality)

6-point MS Minchyo font characters were recorded at an aimed density, and the resulting characters were evaluated for roughness through a magnifying glass according to the following criteria.

A: No roughness was observed.

B: Slight roughness was observed.

C: Roughness was observed, however, the resulting characters were legible, which was the lowest usable level.

D: Significant roughness was observed, and the resulting characters were scratchy, which could not be put into practical use.

(Color Contamination (Bleeding-Out or Crease))

One dot of each of inks Y, M, C and K was recorded at 720 dpi to be adjacent to each other, and the resulting two adjacent dots were evaluated for color contamination (bleeding-out or crease) through a magnifying glass according to the following criteria.

A: The shapes of the two adjacent dots kept a true, circle, and no bleeding-out was observed.

B: The shapes of the two adjacent dots kept a nearly true circle, and little bleeding-out was observed.

C: The two adjacent dots showed a little bleeding-out, and the dot shapes were slightly deformed, however, which was the lowest usable level.

D: The two adjacent dots showed bleeding-out and were contaminated with each, which could not be put into practical use.

The results are shown in Table 7.

TABLE 7

| Sample No. | 30° C., 80% RH | | | | 25° C., 20% RH | | | | Ejection Property | Remarks |
|---|---|---|---|---|---|---|---|---|---|---|
| | PVC | | YUPOFGS | | PVC | | YUPOFGS | | | |
| | *a) | *b) | *a) | *b) | *a) | *b) | *a) | *b) | | |
| 1 | D | D | D | D | D | C | D | C | C | Comp. |
| 2 | B | B | B | B | B | B | B | B | A | Inv. |
| 3 | B | B | B | B | B | B | B | B | B | Inv. |
| 4 | C | C | C | C | B | B | B | B | B | Inv. |
| 5 | B | B | B | B | B | A | B | A | A | Tnv. |
| 6 | A | A | A | A | A | A | A | A | A | Inv. |
| 7 | D | D | D | D | D | D | D | D | B | Comp. |
| 8 | B | B | B | B | B | B | B | B | A | Inv. |
| 9 | C | C | C | C | B | B | B | B | A | Inv. |
| 10 | C | D | C | D | C | C | C | C | C | Comp. |
| 11 | A | B | A | B | B | A | B | A | A | Inv. |
| 12 | B | B | B | B | B | B | B | B | B | Inv. |
| 13 | B | C | B | C | B | B | B | B | B | Inv. |
| 14 | B | C | B | C | B | B | B | B | B | Inv. |
| 15 | B | B | B | B | B | B | B | B | A | Inv. |
| 16 | A | B | A | B | B | A | B | A | B | Inv. |
| 17 | C | C | C | C | C | C | C | C | D | Comp. |
| 18 | B | B | B | B | B | B | B | B | B | Inv. |
| 19 | B | B | B | B | B | B | B | B | B | Inv. |
| 20 | A | A | A | A | A | A | A | A | A | Inv. |
| 21 | C | D | C | D | C | D | C | D | D | Comp. |
| 22 | C | B | C | B | C | B | C | B | D | Comp. |

Comp.: Comparative,

Inv.: Inventive

*a) Character Quality,

*b) Color Contamination (bleeding-out or crease)

As is apparent from Table 7 above, the inventive ink set exhibit excellent ejection property, and improved image quality. Further, the inventive ink sets provide excellent results, regardless of ambient condition under which an ink image was recorded.

EFFECTS OF THE INVENTION

The present invention can provide and actinic ray curable composition with a low viscosity, which is capable of being cured with high speed, and forms a coating layer with ray curable ink employing it, an image formation method employing it, and an ink-jet recording apparatus employing it.

What is claimed is:

1. An actinic ray curable composition comprising, as a photopolymerizable compound, both an oxetane compound with an oxetane ring and an alicyclic epoxy compound, and a non-reactive compound having a viscosity at 25° C. of from 0.1 to 20 mPa·s and a boiling point of not less than 200° C. wherein
   the actinic ray curable composition has a viscosity at 25° C. of from 7 to 40 mPa·s; and
   the alicyclic epoxy compound is an alicyclic compound represented by the following formula A:

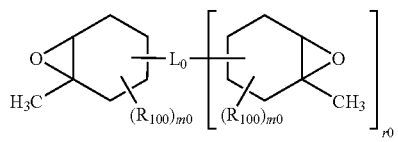

Formula A wherein $R_{100}$ represents a substituent; m0 represents an integer of from 0 to 2; r0 represents an integer of from 1 to 3; and $L_0$ represents a single bond or a (r0+1)-valent linkage group having a carbon atom number of from 1 to 15, which may contain an oxygen atom or a sulfur atom in the main chain.

2. The actinic ray curable composition of claim 1, wherein the content ratio by weight of the oxetane compound to the alicyclic epoxy compound is 7:3 to 3:7, and the content of the non-reactive compound are from 1 to 50% by weight.

3. The actinic ray curable composition of claim 1, wherein the oxetane compound is an oxetane compound with an oxetane ring having a substituent at the 2-position.

4. The actinic ray curable composition of claim 1, wherein the alicyclic epoxy compound is an alicyclic compound represented by the following formula I or II:

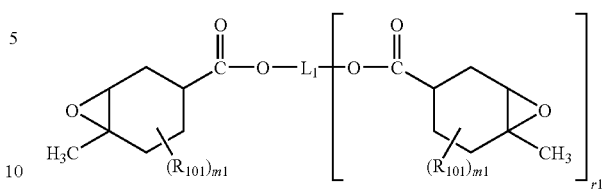

Formula I wherein $R_{101}$ represents a substituent; m1 represents an integer of from 0 to 2; r1 represents an integer of from 1 to 3; and $L_1$ represents a single bond or a (r1+1)-valent linkage group having a carbon atom number of from 1 to 15, which may contain an oxygen atom or a sulfur atom in rhe main chain,

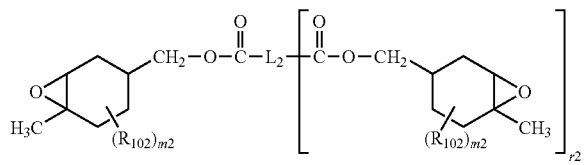

Formula II wherein $P_{102}$ represents a substituent; m2 represents an integer of from 0 to 2; r2 represents an integer of from 1 to 3; and $L_2$ represents a single bond or a (r2+1)-valent linkage group having a carbon atom number of from 1 to 15, which may contain an oxygen atom or a sulfur atom in the main chain.

5. An actinic ray curable ink comprising a pigment and the actinic ray curable composition of claim 1.

6. A process of forming an image on a recording sheet employing an ink-jet recording head, the process comprising the steps of ejecting the actinic ray curable ink of claim 5 from the ink-jet recording head onto the recording sheet to form an image on the recording sheet, and exposing the image to actinic rays between 0.001 seconds and 2.0 seconds after the ink has been ejected onto the recording sheet.

7. A process of forming an image on a recording sheet employing an ink-jet recording head, the process comprising the steps of ejecting the actinic ray curable ink of claim 5 from the ink-jet recording head onto the recording sheet to form an image on the recording sheet, the ink being ejected as ink droplets from each of nozzles of the ink-jet recording head, wherein the ink droplets have a volume of from 2 to 15 pl.

* * * * *

UNITED STATES PATENT AND TRADEMARK OFFICE
CERTIFICATE OF CORRECTION

PATENT NO. : 7,604,343 B2
APPLICATION NO. : 10/995400
DATED : October 20, 2009
INVENTOR(S) : Wataru Ishikawa It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1160 days.

Signed and Sealed this

Fourteenth Day of December, 2010

David J. Kappos
*Director of the United States Patent and Trademark Office*